United States Patent [19]
Izumi et al.

[11] Patent Number: 5,274,456
[45] Date of Patent: Dec. 28, 1993

[54] SEMICONDUCTOR DEVICE AND VIDEO CAMERA UNIT USING IT AND THEIR MANUFACTURING METHOD

[75] Inventors: Akiya Izumi; Iwao Takemoto; Hiroichi Sokei; Masahiko Kadowaki; Atsumu Iguchi, all of Mobara; Junichiro Nakajima, Atsugi; Masayuki Takahashi, Fujisawa; Kunio Niwa, Ebina, all of Japan

[73] Assignees: Hitachi, Ltd., Chiyoda; Echo Co. Ltd., Kanagawa, both of Japan

[21] Appl. No.: 823,617

[22] Filed: Jan. 21, 1992

Related U.S. Application Data

[63] Continuation of Ser. No. 289,041, Dec. 23, 1988, abandoned.

[30] Foreign Application Priority Data

| Dec. 28, 1987 | [JP] | Japan | 62-335972 |
| Jun. 1, 1988 | [JP] | Japan | 63-132763 |
| Jul. 18, 1988 | [JP] | Japan | 63-176911 |

[51] Int. Cl.$^5$ .................... H04N 5/30; H04N 5/225
[52] U.S. Cl. .................... 358/209; 358/225; 358/909; 354/295; 359/808
[58] Field of Search ............... 358/209, 254, 295, 225, 358/213.11, 909, 229; 354/79, 195.12, 295; 350/432, 463, 242, 253, 501, 502, 252

[56] References Cited

U.S. PATENT DOCUMENTS

| 2,540,953 | 2/1951 | Kessler | 350/242 |
| 4,148,551 | 4/1979 | MacAually | 350/242 |
| 4,148,565 | 4/1979 | Gunst | 350/418 |
| 4,298,266 | 11/1981 | Ludwig | 354/286 |
| 4,416,526 | 11/1983 | Iomori et al. | 354/195.12 |
| 4,491,865 | 1/1985 | Danna et al. | 358/229 |
| 4,594,613 | 6/1986 | Shimbori et al. | 358/209 |
| 4,702,371 | 10/1987 | Hoshi et al. | 206/328 |
| 4,767,201 | 8/1988 | Fujita et al. | 350/432 |
| 4,788,593 | 11/1988 | Ovshinsky et al. | 358/213.13 |
| 4,819,074 | 4/1989 | Suzuki | 358/209 |
| 4,839,723 | 6/1989 | Yoshinaga et al. | 358/229 |
| 4,864,348 | 9/1989 | Fujiwara et al. | 354/295 |
| 4,866,574 | 10/1989 | Hsiung | 361/424 |
| 4,893,143 | 1/1990 | Sheng-Huei | 354/286 |

FOREIGN PATENT DOCUMENTS

| 1-175372 | 7/1989 | Japan |
| 2-027878 | 1/1990 | Japan |

OTHER PUBLICATIONS

*Design Handbook for Imagery Interpretation Equipment*, R. Farrell, Dec. 1975, pp. 6.8–14.

Primary Examiner—Michael T. Razavi
Assistant Examiner—Wendy R. Greening
Attorney, Agent, or Firm—Antonelli, Terry, Stout & Kraus

[57] ABSTRACT

An imaging assembly, which is particularly useful for a video camera unit, comprising a set of lenses, some of which have a non-refractive surface, and an image sensor. A holder is provided for holding both the set of lenses and the image sensor to be aligned with one another. Circuitry is also provided so that the sensitivity of the image sensor can be electrically varied.

26 Claims, 17 Drawing Sheets

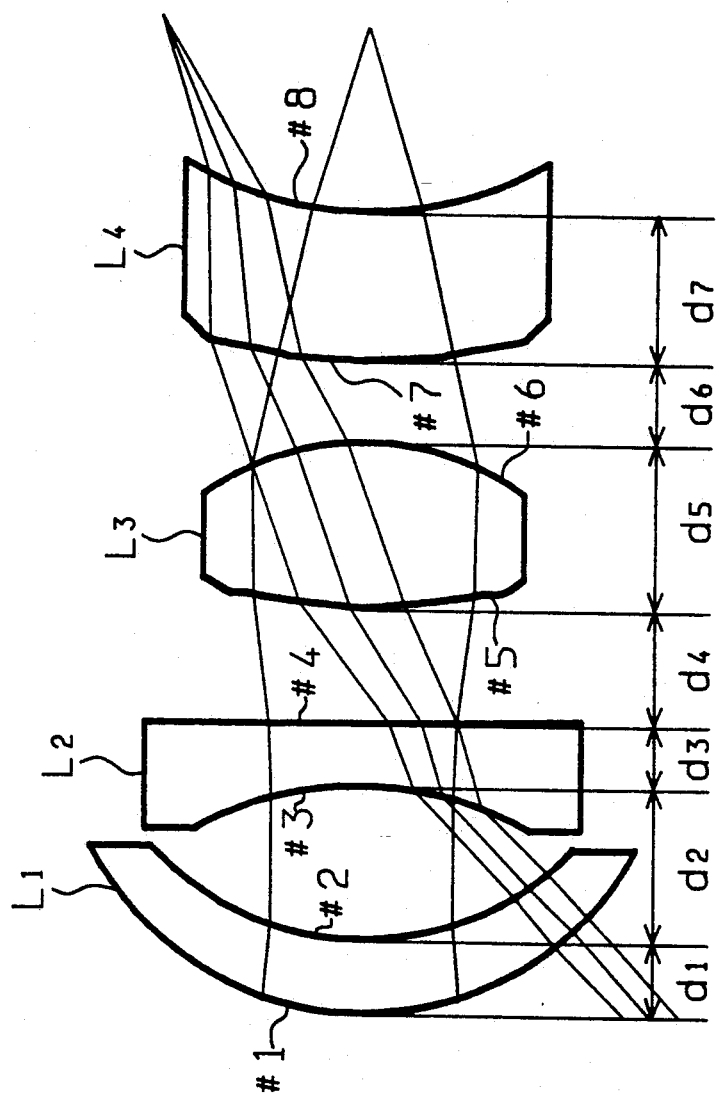

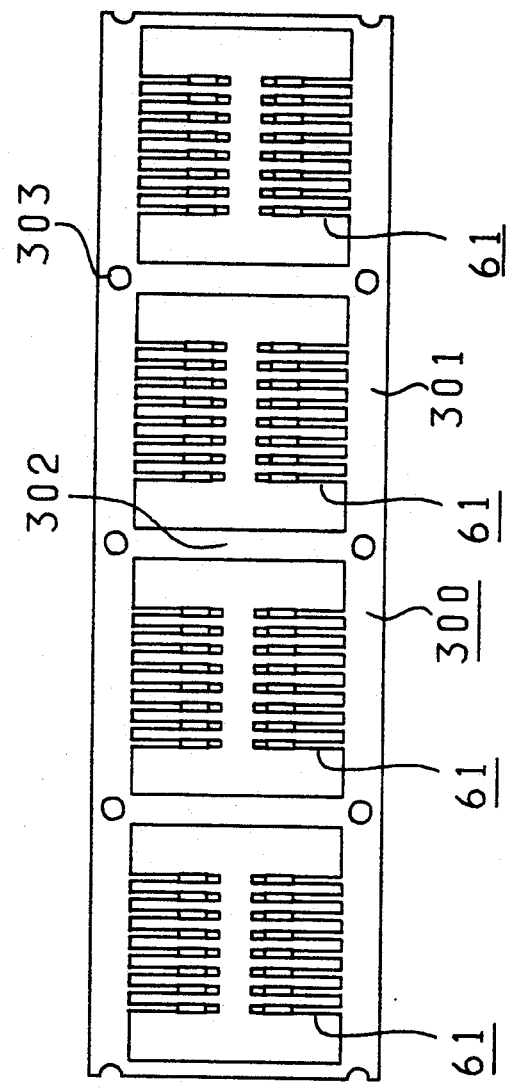

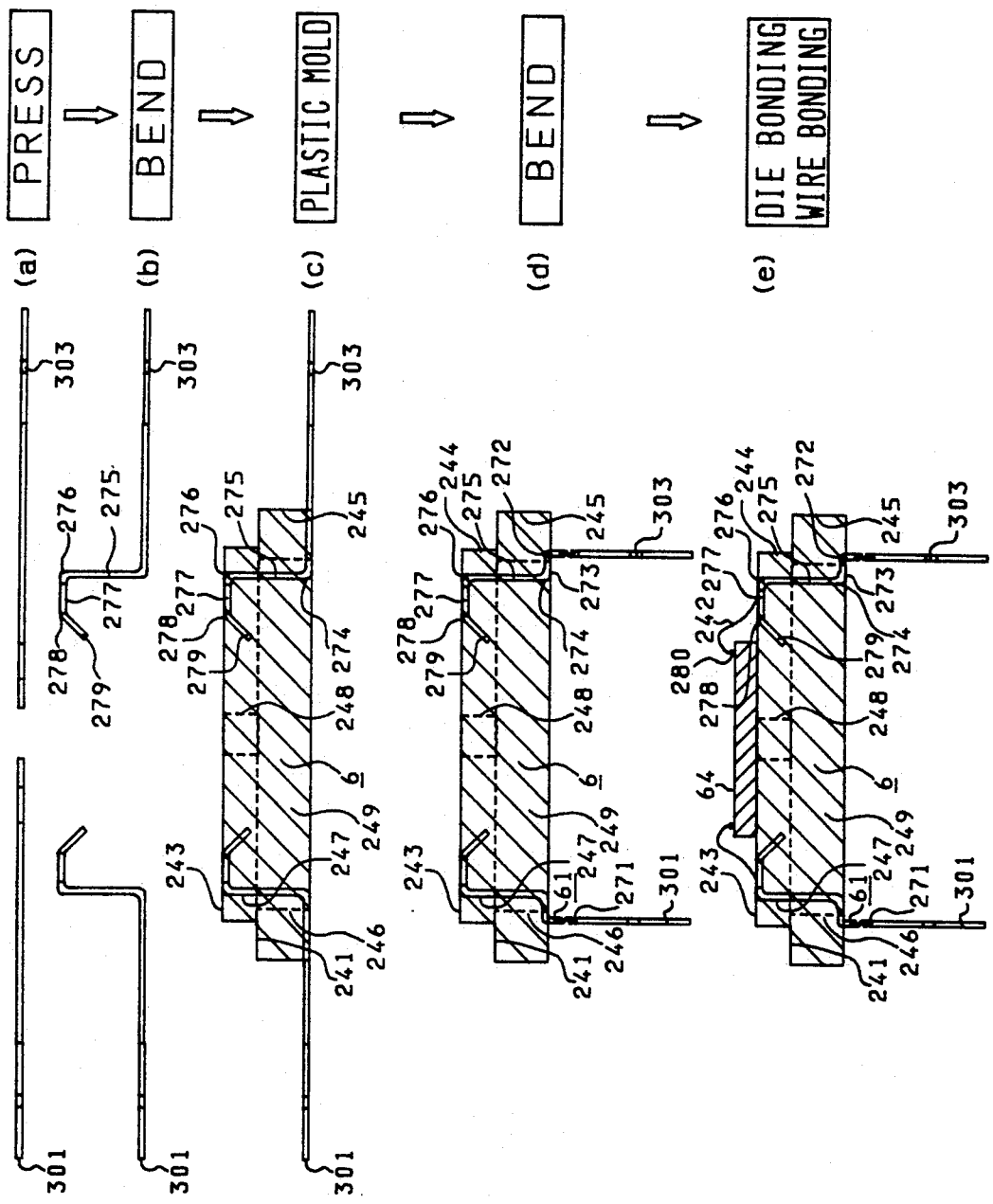

SEMICONDUCTOR DEVICE AND VIDEO CAMERA UNIT USING IT AND THEIR MANUFACTURING METHOD

This application is a continuation application of application Ser. No. 07/289,041, filed Dec. 23, 1988, now abandoned.

BACKGROUND OF THE INVENTION

The present invention relates to a video camera unit and more particularly to a compact and bright video camera unit.

Recently, a very compact ⅓ inch solid-state image pick-up device has been developed and a door scope TV camera, etc. has been experimentally manufactured as its application.

A wide lens used therein is constructed by combining 8 to 10 lenses since it should have certain optical property relative to spherical aberration, astigmatism, distortion aberration, chromatic aberration, sine condition, etc. as disclosed in e.g. JP-A-48-64927. Further, a solid state image pick-up chip (IC chip) constructed by combining a photodiode and a switch MOS FET is disclosed in e.g. JP-A-56-152382. And in the television camera for monitoring, family use, etc., an optical lens used therein is provided with an automatic diaphragm or stop mechanism.

However, the above wide angle lens, which is constructed by many lenses, is not suitable to miniturizing.

Also, the above lens provided with an automatic diaphragm mechanism requires relatively complicated mechanical components and so makes the lens portion in the television camera bulky and requires high production cost therefor. Further, the automatic diaphragm mechanism, which is constructed by relatively complicated mechanical components, is problematic in its reliability due to possible aberration of the mechanical components.

U.S. patent application Ser. No. 102649 (filed Sep. 30, 1987) discloses an image sensor with variable sensitivity.

SUMMARY OF THE INVENTION

An object of the present invention is to provide a very compact or small-sized video camera unit.

Another object of the present invention is to provide an unexpensive video camera unit.

Still another object of the present invention is to provide a video camera unit which provides excellent mass-productivity.

A further object of the present invention is to provide a bright and compact video camera unit.

A still further object of the present invention is to provide a video camera unit in which an electrical diaphragm is allowed.

A yet further object of the present invention is to provide a video camera unit having strong tolerance to external electrostatic noise.

A further object of the present invention is to provide a video camera unit with high reliability.

A further object of the present invention is to provide a video camera unit with high assembling accuracy.

A further object of the present invention is to provide a solid-state image sensor which is suitable to the very small-sized video camera unit.

In accordance with one aspect of the present invention, there is provided a video camera unit comprising a plurality of lenses, some of which have a non-spherical surface, and an image sensor circuit with sensitivity which can be electrically varied.

Since all the lenses are made of plastic, these lenses can be easily shaped by any suitable shaping technique such as injection molding. Thus, a lens having a non-spherical surface which can not be made by a glass lens requiring grinding can be easily made. Therefore, if some non-spherical lenses are used, the spherical aberration, astigmatism, distortion aberration, chromatic aberration, and sine condition which are problematic can be corrected by less number of lenses. Accordingly, it is possible to reduce the number of lenses used in the above video camera unit and to realize compactness, light weight and low production cost thereof.

Further, since the above solid state image pick-up circuit, in which the sensitivity can be electrically varied, does not require a mechanical diaphragm mechanism, the entire camera can also be greatly small-sized.

Both techniques are important techniques indispensable to the very small-sized monitor camera.

BRIEF DESCRIPTION OF THE DRAWINGS

FIG. 3 is a view for explaining lens part used in the camera units shown in FIGS. 1 and 5.

FIGS. 12A to FIG. 17 are developments of main components of the video camera unit shown in FIGS. 1A and 1B, in which FIG. 12A is a sectional view of a holder 1 and FIG. 1B is a plan view thereof, FIG. 16 is a plan view of a lead frame used in assembling the solid-state image sensor 6, and FIG. 17 is a flow diagram showing a series of five steps in assembling the solid-state image sensor.

DESCRIPTION OF THE PREFERRED EMBODIMENTS

Embodiment 1

Figure 2A:
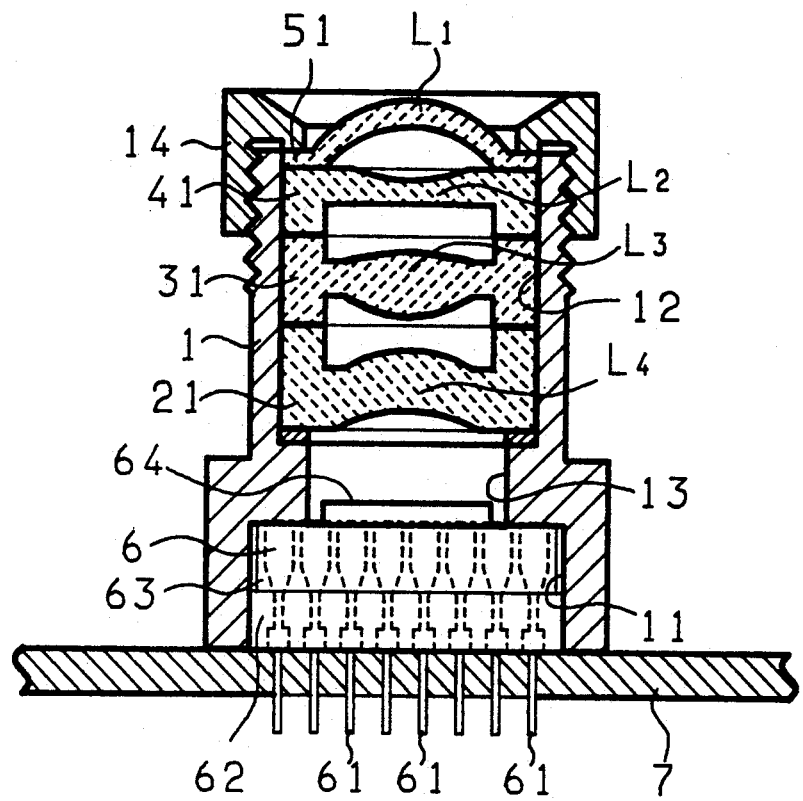
FIG. 2A is a sectional view of a video camera unit in accordance with another embodiment of the present invention and FIG. 2B is a plan view thereof.

FIGS. 2A to 4 and Table 1 show a wide angle lens in accordance with the present invention and a very small-sized TV camera unit. FIG. 2A is a sectional view of the camera unit and FIG. 2B is a plan view when viewed from the bottom side thereof (image pick-up device side).

Figure 1A:
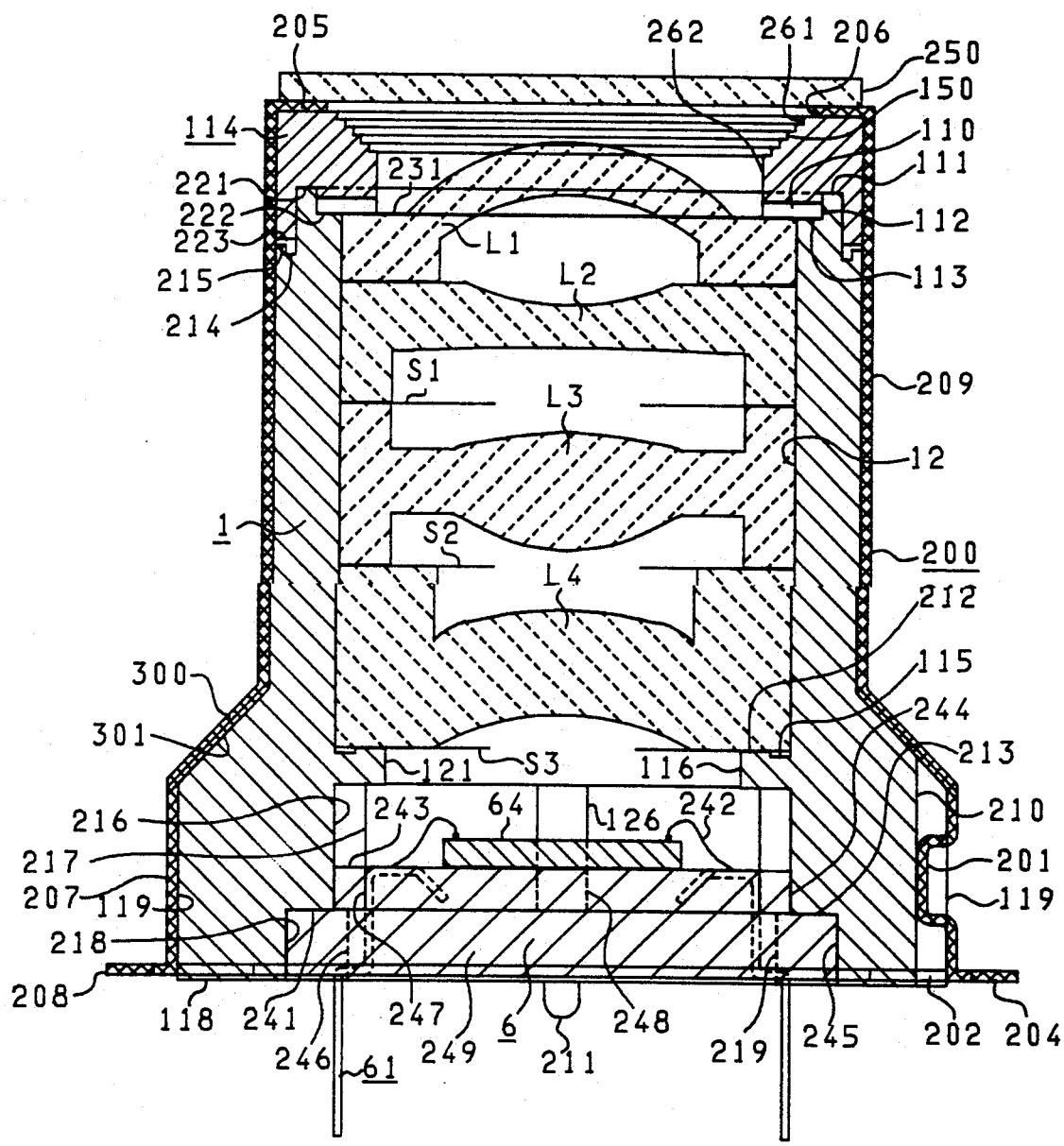
FIG. 1 is a sectional view of a video camera unit in accordance with one embodiment of the present invention and FIG. 1B is a plan view thereof.
Figure 1B:
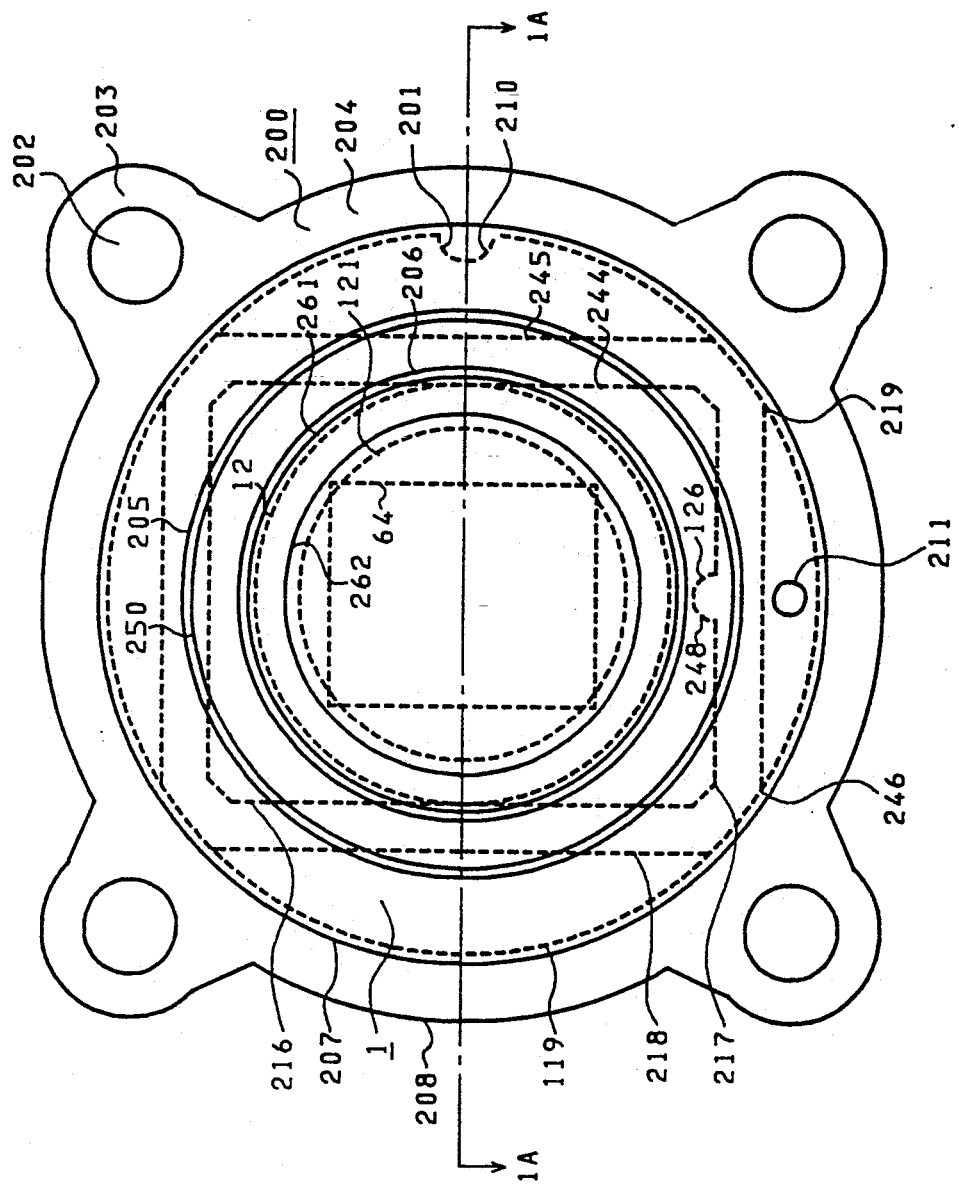
Figure 2B:
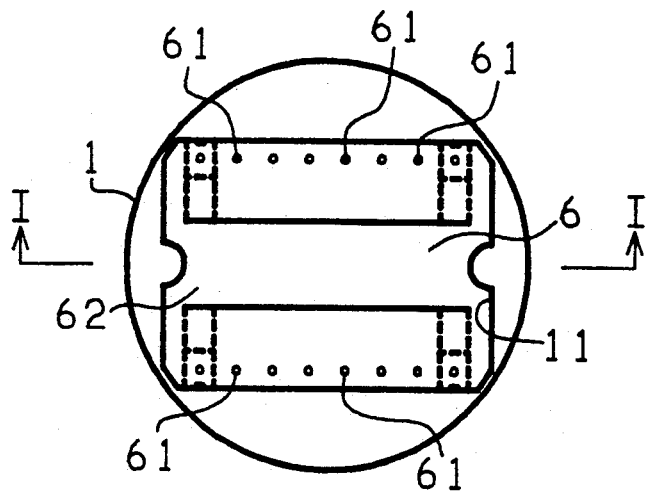

In FIGS. 2A and 2B, 1 is a cylindrical lens holder with an image sensor receiving section 11 at its base. L1, L2, L3 and L4 are a set of plastic lenses received in a lens receiving section 12 of the lens holder 1. 6 is a solid-state image sensor received in the image sensor receiving section 11, which is provided so as to correspond to the above lenses.

The lens holder 1 is made of material having a thermal expansion coefficient approximately to that of the plastic lenses L1 to L4, e.g. synthetic resin. The image sensor receiving section 11 is formed in a rectangular parallelepiped shape so as to perfectly receive the image sensor 6. An inward flange 13 is provided between the image sensor receiving section 11 and the lens receiving section 12, and allows the lenses L1 to L4 and the solid-state image device 6 to be aligned with each other. A ring-shaped cover 14 is attached at an end of the holder 1 so that the lenses are not fallen out.

Figure 4:
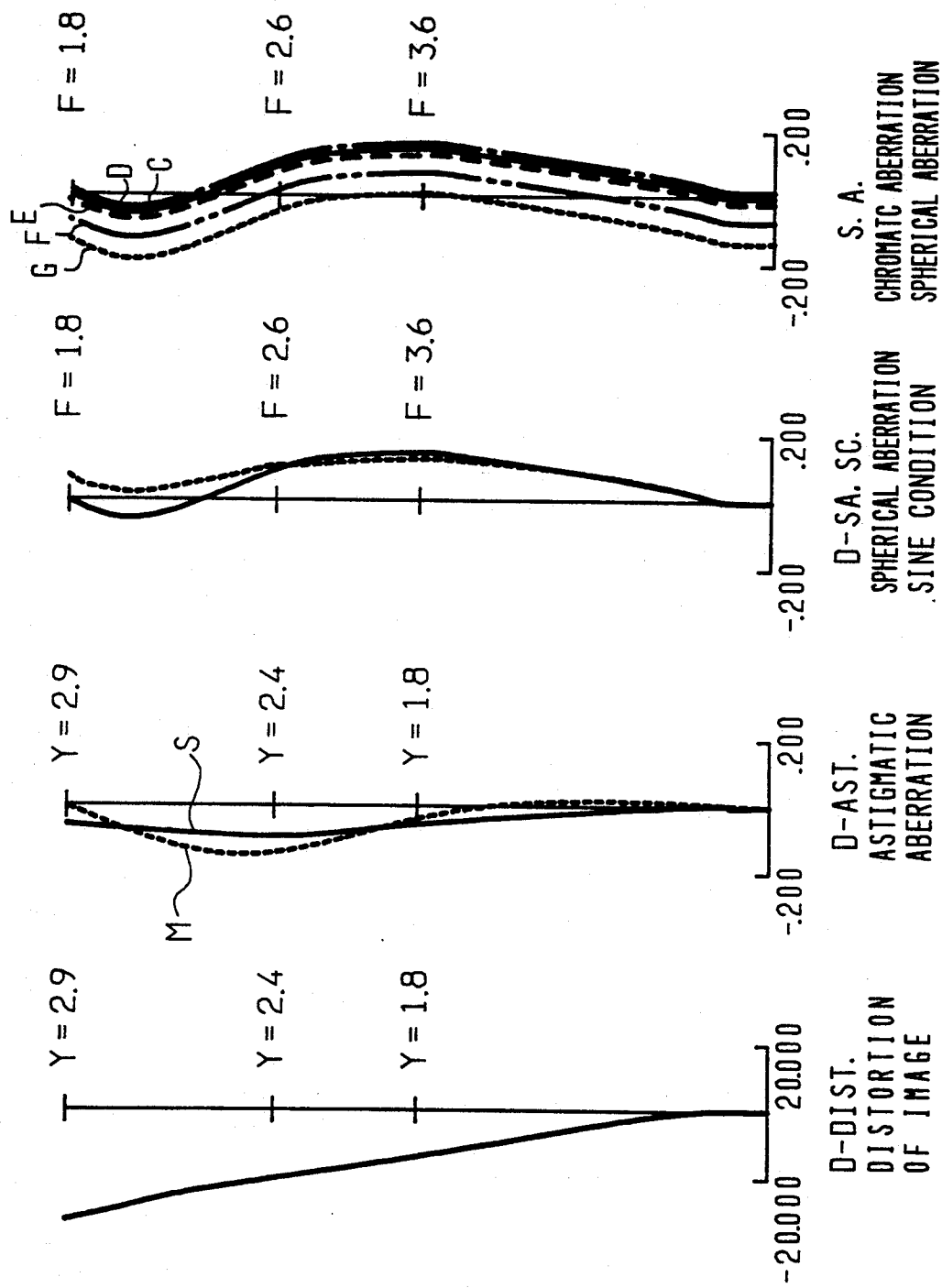
FIG. 4 is a graph showing its characteristics.

The plastic lenses L1 to L4 are designed with constants indicated in Table 1 and have the characteristics as shown in FIG. 4. A first lens L1 and a second lens L2 are concave lenses and a third lens L3 and a fourth lens L4 are convex lenses. Both front and rear surfaces #5 and #6 of the third lens L3 and a front surface of the fourth lens L4 are made non-spherical. These lenses L1 to L4 are, at their peripheral portion, provided with ribs 21, 31, 41 and 51 fit in the above lens receiving section to maintain prescribed distances between the lenses L1 to L4.

The solid-state image sensor 6 is constructed by a substrate 62, a solid-state image sensor semiconductor chip 64 mounted on the substrate 62 and leads for external connection attached on two sides of the substrate 62. The size of the chip 64 is set at e.g. ½ inch in its diagonal line.

The construction of the lenses L1 to L4 will be explained with reference to FIGS. 3 and 4 and Tables 1 and 2.

FIG. 3 shows the detail of only the lenses L1 to L4 shown in FIG. 2A. In FIG. 3, #1 to #8 denote lens surface numbers in order from left. Table 1 indicates one example of respective design constants of a lens surface curvature radius $\gamma$, a distance d between the lenses, a refraction index n and a dispersion rate $\nu$ corresponding to the lens surfaces #1 to #8 and the lenses L1 to L4. The curvature radius $\gamma$ and the distance d are represented in a ratio to E.F.L. assuming that the effective focal length E.F.L. of the four lenses L1 to L4 is set at 1.

In order to obtain a prescribed characteristic using a smaller number of lenses, it is desired to adopt the following idea.

① The first lens L1 is a meniscus positive lens with its convex surface (#1) facing the object side.
② The second lens L2 is a negative lens with both concave surfaces (#3, #4).
③ The third lens L3 is a non-spherical lens with both convex surfaces (#5, #6).
④ The fourth lens L4 is a meniscus positive lens with its convex surface facing the object side.

The constants of the respective lenses and lens surfaces may be preferably selected to satisfy the following conditions.

$$f1 > 50f \tag{1}$$

$$0.4f \times d2 > 0.6f \tag{2}$$

$$1.0f > r3$$

where f is an effective focal length of the lenses L1 to L4; f1 is an individual focal distance of the lens L1; d2 is a distance between the lens surfaces #2 and #3; and r3 is a curvature radius of the lens surface #3.

The above conditions are set for the following reasons.

With respect to the condition (1), if $f1 < 50f$, produced negative distortion aberration is large, and the curvature of field will be excessively corrected. A coma aberration will also be produced.

With respect to the condition (2), if the value of d2 is lower than the lower limit, an inward coma aberration will be produced, and if it exceeds the upper limit, an outward coma will be produced.

With respect to the condition (3), if the value of r3 is lower than the effective focal length f and becomes close to a lower limit, negative distortion aberration will be produced.

The aberrations can be further preferably corrected by using both non-spherical surfaces of the lens L3 and the non-spherical surface of the lens L4 facing the object side.

The respective aberration produced in this embodiment are shown in FIG. 4. In FIG. 4, D, G, C, F and E represent the spherical aberration and the chromatic aberration for D-, G-, C- and E-lines. M and S denote a meridional section and a sagittal section.

As seen from the aberration curves shown in FIG. 4, the spherical aberration is satisfactorily corrected and so flare with the lenses opened is very small. Further, as understood from Table 3 indicating Seidel aberrations, the coma aberration is satisfactorily corrected, thus providing improved imaging performance.

The lens surfaces #5 to #7 are formed in a non-spherical shape. The curvature radii asterisked by *1-*3 can be calculated using the data in Table 2 and the calculating method indicated below Table 2.

Embodiment 2

Figure 5:
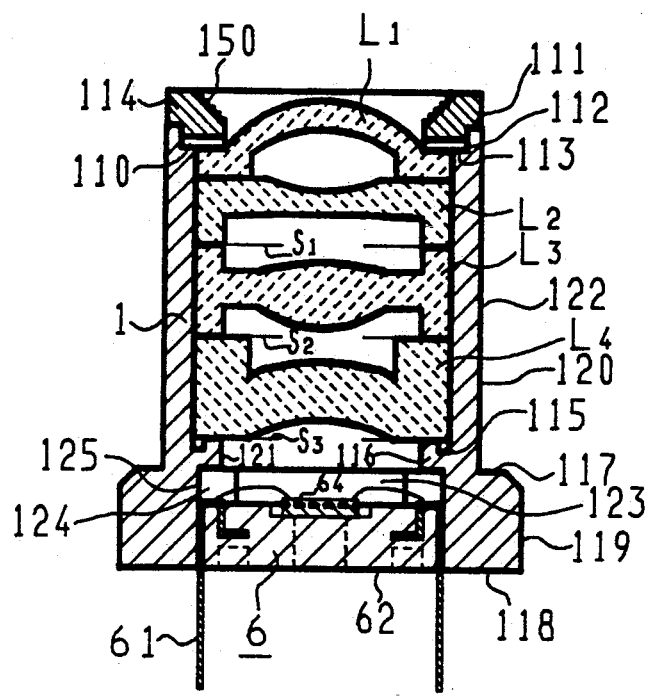
FIG. 5 is a sectional view of a video camera unit in accordance with still another embodiment of the present invention.
Figure 6:
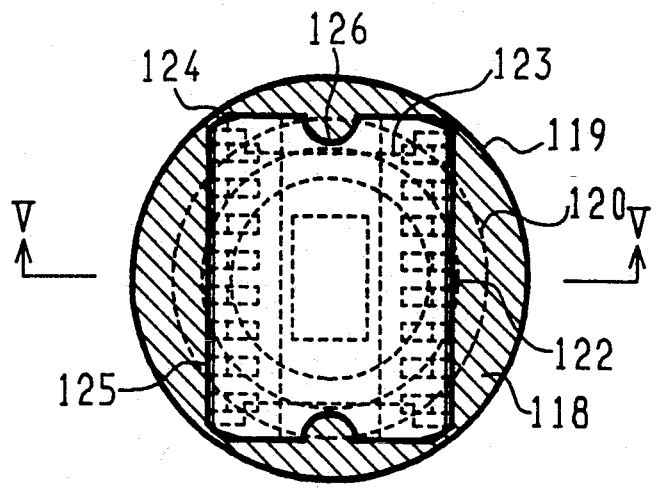
FIG. 6 is a plan view thereof.

FIG. 5 is a sectional view of a video camera unit according to another embodiment of the present invention and FIG. 6 is a plan view thereof when viewed from below (lenses L1 to L4, cover 114 and the upper end of the holder 1 are omitted). FIG. 5 shows a section taken along V-V line in FIG. 6.

In FIGS. 5 and 6, 114 is a cover assembled after lenses L1 to L4 are received in the lens holder 1. The upper end 111 of the lens holder 1 is adapted to be higher than the edge portion of the lens L1, and a recess consisting of a vertical section 112 and a horizontal bottom section 113 is formed inside the upper end 111. The horizontal bottom section 113 is at substantially the same as or slightly higher level than the edge portion of the lens L1.

The step portion consisting of 111 to 113 thus formed at the upper end of the lens holder 1 makes it easy to fix the cover 114 in the holder 1 and also increases the bonding area of the cover 114 to the step portion 111 to 113, thus increasing the bonding strength. Since the bottom of the cover 114 is kept into contact with both the edge of the lens L1 and the bottom section 113 of the lens holder by means of bonding agent, etc., thus providing a stabilized structure of the video camera unit.

A recess 110 provided below the cover 114 is used as an injection opening of the bonding agent.

A projection 116 and a recess 115 are provided at the lower inside portion of the lens holder 1. The recess 115 serves as a drain opening for air extruded when the lenses L4 to L1 are successively piled, and prevents the lenses L4 to L1 from floating up due to air. The projection 116 is efficient to decide the distance between the lowest lens L4 and the solid-state image sensor chip 64. The projection 116 also serves as a light shader for preventing diffused refraction light from being incident to the chip 64 to cause a flare phenomenon. S1 to S3 are also dull black light shading plates formed in a doughnut shape for the same purpose.

A flat outward projection 117, provided at the lower part of the lens holder 1, can be used as a stopper when the video camera unit is inserted into a hole provided in a camera body.

An inside inclined surface 150 of the cover 114, which is formed stepwise, serves to diffusely reflect unnecessary light projected thereto to the outside.

A solid-state image sensor 6 is fit into the holder 1 along the lower side inner wall 12 thereof. Then, a semi-circle 126 projected on the bottom of the holder 1 and the plastic substrate 62 of the device 6 has a semi-circle concave portion in accordance with the shape of tee semi-circle portion 126. The bottom 118 of the holder 1 is hatched for convenience of clarity in the plan view of FIG. 6.

Thus, although the device 6 is aligned in the horizontal plane (X and Y directions) using the inner walls 125 and 126 of the holder, in the vertical direction (Z direction) it is aligned using step portions 123 and 124 (FIG. 5) located slightly behind from the bottom of the holder 1 to decide the focusing distance of the lenses L1 to L4 for the image pick-up chip 64. In the plan view of FIG. 6, the step portions 123 and 124 are provided at two upper and lower positions. Namely, steps are formed at boundaries 123 and 124. Since the step portions 123 and 124 are in contact with a portion of the upper surface of a package 62 where a lead pin 61 is not provided, the thickness and bending of the lead pin 61 do not influence the distance accuracy between the lenses and the image sensor chip.

Embodiment 3

Figure 7:
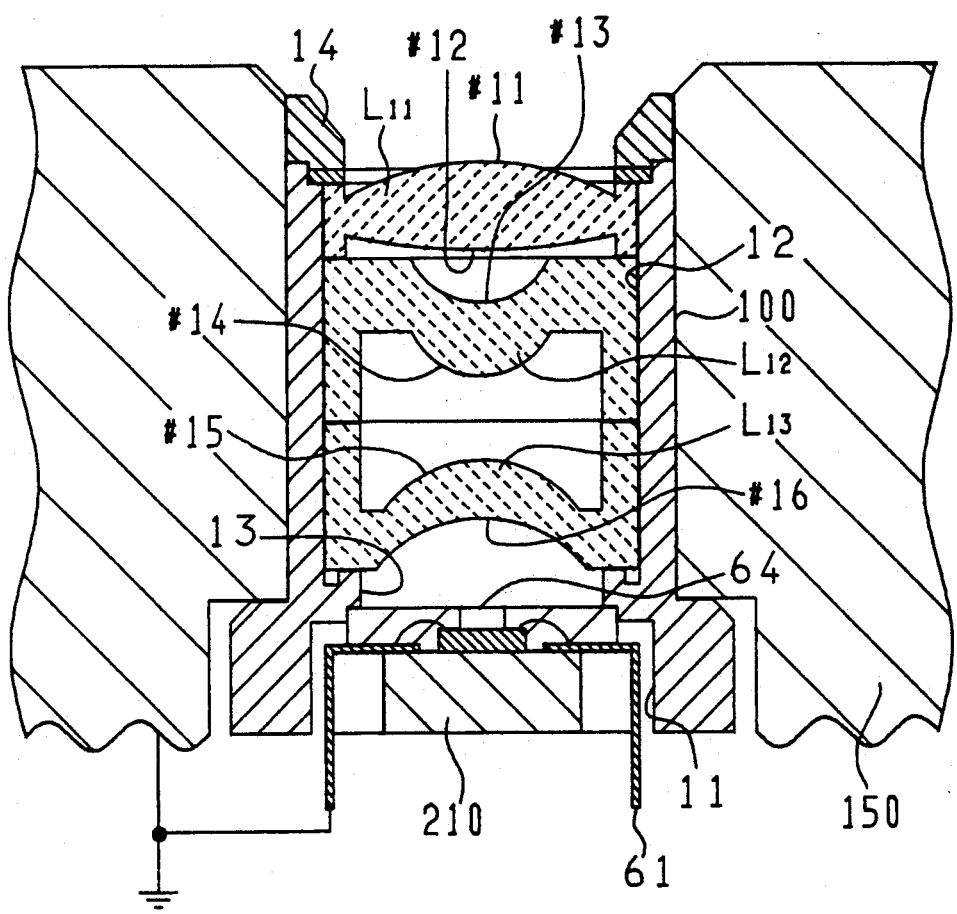
FIG. 7 is a sectional view of a video camera unit in accordance with a further embodiment of the present invention.

FIG. 7 is a sectional view of a video camera unit according to still another embodiment of the present invention.

One feature of this embodiment different from the embodiments of FIGS. 1 and 5 is that the viewing angle which is not a wide angle but a normal angle is adopted, thereby decreasing the total number of used lenses by one (i.e. three lenses are used) to allow cost reduction.

A lens L11 is a positive lens with both convex surfaces (#11, #12); a lens L12 is a meniscus positive lens with one concave surface (#13) facing a subject and another non-spherical surface (#14) on the image pick-up device side; and a lens L13 is a meniscus positive lens with one non-spherical surface (#15) on the subject side.

Figure 8:
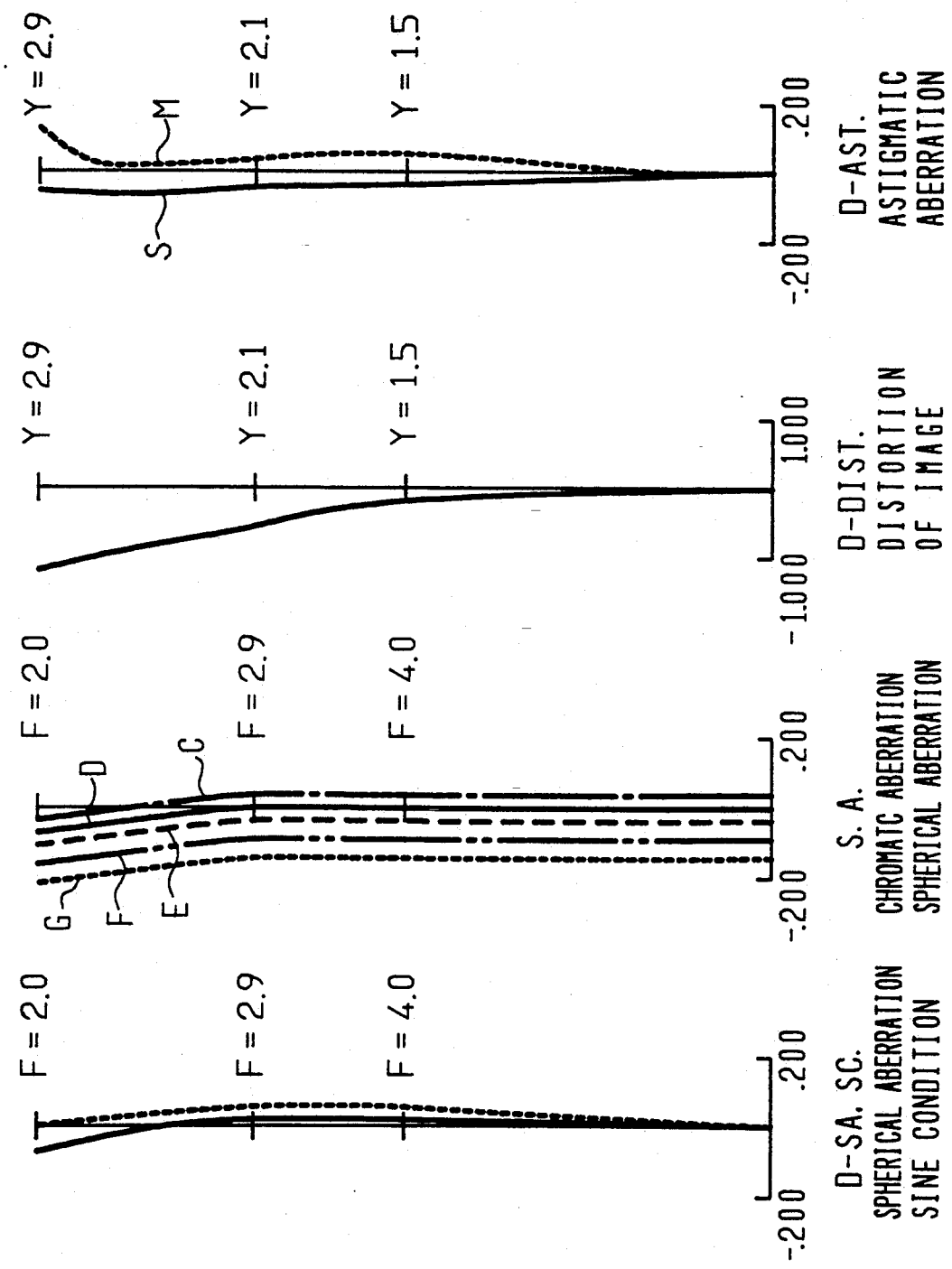
FIG. 8 is a graph showing the characteristic of a lens used in the video camera unit of FIG. 7.

The constants of the respective lens surfaces are indicated in Table 4, the constants of the respective non-spherical lens surfaces are indicated in Table 5 and several characteristics such as the Seidel aberrations of the respective lens surfaces are shown in Table 6 and FIG. 8. The respective symbols and the asterisks therefor, which have the same meanings as in the embodiment of FIG. 3, will be not further explained.

The optimum design constants of the respective lenses and lens surfaces are as follows.

$$f2 > 0 \tag{4}$$

$$r6 > 0 \tag{5}$$

$$0.25 < d4 < 0.35 \tag{6}$$

$$f3 > f2 > f1 > 0 \tag{7}$$

$$r4 > 0 \tag{8}$$

If such conditions are adopted, as seen from the aberration curves of FIG. 8, the higher order spherical aberration and coma aberration are satisfactorily corrected and so flare with the lenses opened is very small. Further, as understood from the Seidel aberrations indicated in Table 3, the coma aberration is satisfactorily corrected, thus providing improved imaging performance.

Another feature of this embodiment resides in that the image pick-up device 64 is electrostatically shield from the outside using a holder 100 containing carbon.

The holder 100 can be fabricated by mixing a suitable amount of glass into polycarbonate resin, mixing carbon thereinto in a rate of 10 to 20% and transfer-molding the resin.

The holder 100 is A.C. grounded together with the lead pin 61 of the solid-state image sensor chip 64 through a chassis 150 of a camera body when the video camera unit is attached to the camera body.

In place of carbon, silver particles may be used as material to be contained into the holder 100.

The above video camera unit can be miniturized so as to have the entire length and the maximum diameter of about 15 mm, respectively. Further, in accordance with this embodiment, wide angle, standard and telescope optical systems can be constructed.

For example, the focal length is decided to f=3.6 to 5.2 mm (wide angle), f=5.3 to 8.3 mm (standard), and f=15 mm (telescope). The brightness is decided to F=1:1.6 to 2.2. The view angle is decided to 60° to 90° (wide angle), 40° to 60° (standard) and 15° to 40° (telescope).

Embodiment 4

The solid-state image sensor chip 64 provides an electrically variable sensitivity and to this end, it has a function of electrically adjusting the diaphragm or shutter speed. This is very convenient for the fixed lens system mentioned above. Now referring to FIG. 9, an internal circuit of the chip 64 will be explained and referring to FIG. 10 a block arrangement of the entire image sensor (camera) circuit will be explained.

Figure 9:
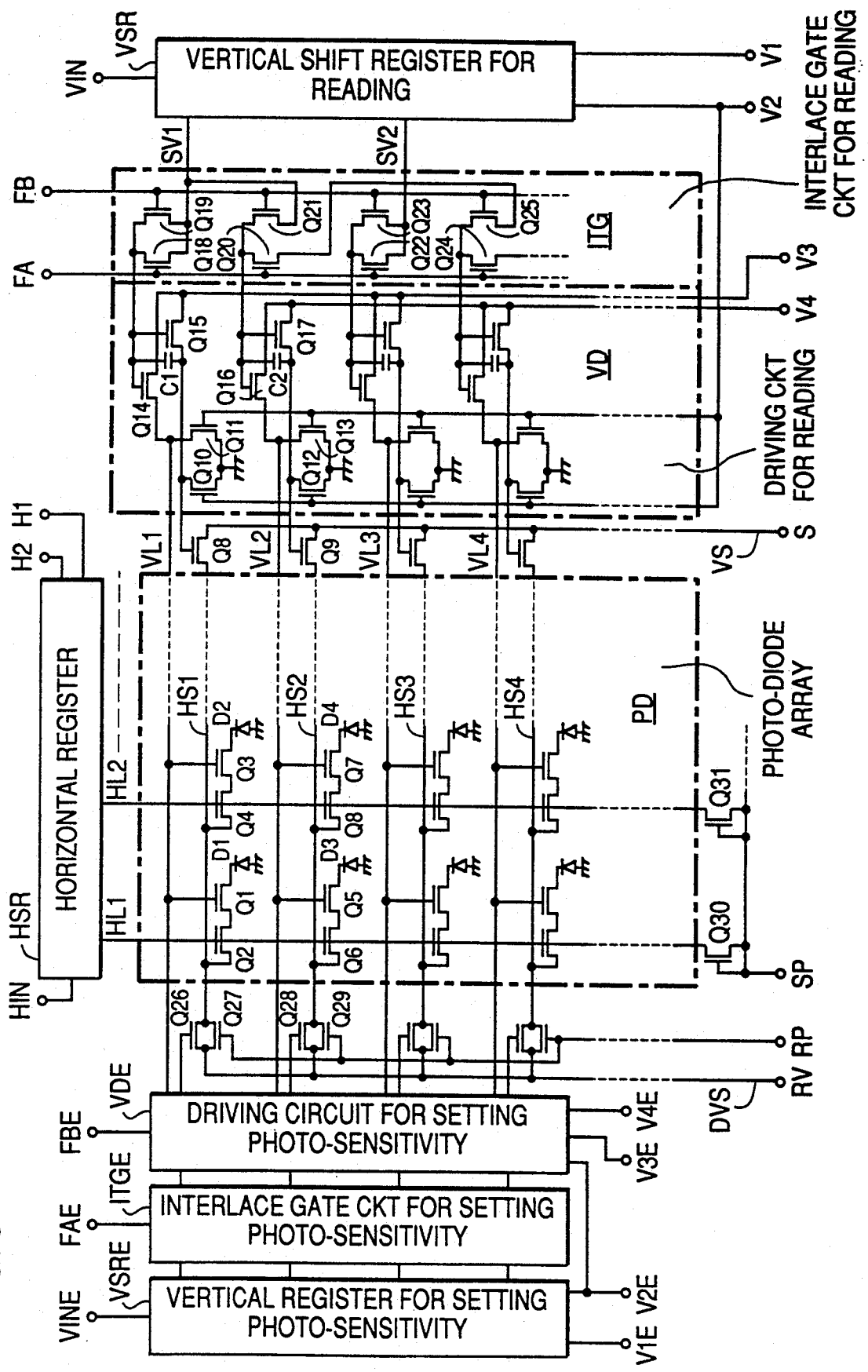
FIG. 9 is a circuit diagram showing a principal part of one embodiment of an internal circuit of a solid-state image sensor chip in accordance with the present invention.

FIG. 9 is a circuit diagram showing one example of a TSL (Transversal Signal Line) system solid-state image sensor to which the present invention is applied. The circuit elements shown in FIG. 9 are fabricated on a single semiconductor substrate such as single crystal silicon by a known semiconductor integrated circuit manufacturing technique, although not necessarily limitative thereto. Principal circuit blocks shown in the figure are drawn in conformity with the actual geometrical layout on a semiconductor chip.

Symbols "0" in upper and lower regions in the figure are signal terminals which are electrically connected with the leads 61 of the solid-state image sensor 6 shown in FIGS. 1 and 2. Although 16 lead pins 61 are shown in FIGS. 1 and 2 for the sake of convenience, such 24 lead pins may be used in conformity to the internal circuit of FIG. 9 (so called 24 pin DIL package).

A picture element array PD will first be explained. In FIG. 9, a part of the array PD which consists of four rows and two columns is representatively illustrated. In order to prevent complication of the illustration, circuit symbols are put only to picture element cells for two rows among the four rows. One picture element cell is defined by a series circuit which consists of a photodiode D1, a switching MOSFET Q1 having its gate coupled to a vertical scanning line VL1, and a switching MOSFET Q2 having its gate coupled to a horizontal scanning line HL1. The respective output nodes of the other similar picture element cells (D2, Q3, Q4 . . . ) which are disposed along the same row (in the horizontal direction) as the picture element cell composed of the photodiode D1 and the switching MOSFETs Q1 and Q2 are coupled to a horizontal signal line HS1 which extends horizontally as viewed in the figure. Similarly, picture element cells which are the same as the above are coupled in regard to the other rows.

The horizontal scanning line HL1 which is exemplarily illustrated extends vertically as viewed in the figure and is coupled in common to the gates of switching MOSFETs Q2, Q6 . . . of picture element cells which are disposed along the same column. Picture element cells which are disposed along the other columns are also coupled to the corresponding horizontal scanning lines HL2 . . . in the same way as the above.

In this embodiment, switching MOSFETs Q8, Q9 and Q26, Q28 are provided at both ends, respectively, of the horizontal signal lines HS1 to HS4 . . . which constitute the picture element array PD, in order to add an electrically virtual automatic diaphragm function to the solid-state image sensor, that is, in order to make variable the substantial storage time with respect to the photodiodes. The switching MOSFETs Q8 and Q9 which are disposed at the right-hand end operate so as to couple the respective horizontal signal lines HS1 and HS2 to an output line VS which extends vertically. The output line VS is coupled to a terminal S through which a read-out signal is transmitted to the input terminal of a preamplifier which is externally provided. The switching MOSFETs Q26 and Q28 which are disposed at the left-hand end operate so as to couple the respective horizontal signal lines HS1 and HS2 to a dummy (reset) output line DVS which extends vertically. Although not necessarily limitative, the output line DVS is coupled to a terminal RV so that it is possible to deliver from the external output terminal RV a signal on the dummy output line DVS as desired.

In this embodiment, the horizontal signal lines HS1 to HS4 for the exemplarily illustrated four rows are respectively provided with switching MOSFETs Q27, Q29 which are turned ON in response to a reset signal that is supplied from a terminal Rp during the horizontal blanking period, although not necessarily limitative thereto. When the MOSFETs Q27, Q29 . . . are turned ON, a predetermined bias voltage (not shown) is applied to each of the horizontal signal lines HS1 to HS4 from the terminal RV through the dummy output line DVS. The reason why the MOSFETs Q27, Q29 . . . for resetting are provided is as follows. Semiconductor regions such as the drains of the switching MOSFETs which are coupled to the horizontal signal lines HS1 to HS4 may also have sensitivity to light, and therefore false signals (which may cause smear or blooming) formed by such parasitic photodiodes may be accumulated on the horizontal signal lines which are floating when they are in a non-select state. Therefore, in this embodiment all the horizontal signal lines HS1 to HS4 are reset to said predetermined bias voltage by making use of the horizontal blanking period as described above. Thus, in regard to each of the selected horizontal signal lines, a picture signal is always taken out in a state wherein the above-described false signals are reset, and it is therefore possible to reduce false signals contained in the output picture signal by a large margin. It should be noted that the false signals (causing smear or blooming) are described in detail, for example, in JP-A-57-17276.

The horizontal scanning lines HL1, HL2 . . . are supplied with a horizontal scanning signal which is formed in a horizontal shift register HSR.

The scanning circuit which effects a vertical select operation (i.e., horizontal scanning operation) in the above-described picture element array PD is composed of the following circuits.

In this embodiment, a pair of scanning circuits are provided in conformity with the provision of the pairs of switching MOSFETs Q8, Q9 . . . and Q26, Q28 . . . at both ends of the horizontal signal lines HS1 to HS4 . . . in the picture element array PD.

In order to enable application to industrial uses, this embodiment is arranged so that it is possible to effect scanning processes in addition to the interlaced scanning, i.e., a scanning process in which two rows can be selected simultaneously, and a noninterlaced scanning process. The following scanning circuit is provided at the right-hand side of the picture element array PD. Namely, a vertical shift register VSR forms output signals SV1, SV2 . . . which are employed for reading. These output signals SV1, SV2 are supplied to the vertical scanning lines VL1 to VL4 and also to the gates of the switching MOSFETs Q8, Q9 through an interlace gate circuit ITG and a driver circuit VD.

The interlace gate circuit ITG operates in the following manner in order to effect a vertical select operation (i.e., horizontal scanning operation) in the interlace mode. Namely, in the case of a first (odd-number) field, the vertical scanning lines VL1 to VL4 are selected in such a manner that a combination of adjacent vertical scanning lines, i.e., one scanning line VL1 and a pair of adjacent vertical scanning lines VL2 and VL3, are simultaneously selected. More specifically, the output signal SV1 from the vertical shift register VSR is output to the vertical scanning line VL1 for selecting the horizontal signal line HS1 by the operation of a switching MOSFET Q18 which is controlled by an odd-number field signal FA. Similarly, the output signal SV2 from the vertical shift register VSR is output to both the vertical scanning lines VL2 and VL3 so as to simultaneously select the horizontal signal lines HS2 and HS3 by the operation of switching MOSFETs Q20 and Q22 controlled by the signal FA. Thereafter, select signals for selecting a pair of horizontal signal lines which are combined according to the same sequence as the above are formed.

In the case of a second (even-number) field, the vertical scanning lines VL1 to VL4 are selected in such a manner that a combination of adjacent vertical scanning lines, i.e., two pairs of vertical scanning lines VL1, VL2 and VL3, VL4 are simultaneously selected. More specifically, the output signal SV1 from the vertical shift register VSR is output to the vertical scanning lines VL1 and VL2 for selecting the horizontal signal lines HS1 and HS2 by the operation of switching MOSFETs Q19 and Q21 which are controlled by an even-number field signal FB. Similarly, the output signal SV2 from the vertical shift register VSR is output to the vertical scanning lines VL3 and VL4 so as to simultaneously select the horizontal signal lines HS3 and HS4 by the operation of switching MOSFETs Q23 and Q25 which are controlled by the signal FB. Thereafter, select signals for selecting a pair of horizontal signal lines which are combined according to the same sequence as the above are formed.

A plurality of different kinds of horizontal scanning operation which will be explained hereinafter are realized by a combination of the above-described interlace gate circuit ITG and the driver circuit DV described below.

The output signal from the interlace gate circuit ITG which corresponds to the above-described one vertical scanning line VL1 is supplied to the gates of switching MOSFETs Q14 and Q15. The mutual drain electrode of these switching MOSFETs Q14 and Q15 is coupled to a terminal V3. The switching MOSFET Q14 supplies a signal supplied thereto from the terminal V3 to the vertical scanning line VL1. The switching MOSFET Q15 supplies a signal supplied thereto from the terminal V3 to the gate of the switching MOSFET Q8 which couples the horizontal signal line HS1 to the output line VS. In order to prevent the high level of the output signal from lowering by an amount corresponding to the threshold voltage of the switching MOSFETs Q14 and Q15, a capacitor C1 is provided between the gate of the MOSFET Q14 and the output side (source side) of the MOSFET Q15, although not necessarily limitative thereto. Thus, when the output signal from the interlace gate circuit ITG is raised to the high level, the potential at the terminal V3 is maintained at the low level and in the meantime the capacitor C1 is precharged. When the potential at the terminal V3 is raised to the high level thereafter, the gate voltage of the MOSFETs Q14 and Q15 can be raised by the bootstrap action by the capacitor C1.

The output signal from the interlace gate circuit ITG which corresponds to the vertical scanning line VL2 which is adjacent to the above-described vertical scanning line VL1 is supplied to the gates of switching MOSFETs Q16 and Q17. The mutual drain electrode of these switching MOSFETs Q16 and Q17 is coupled to a terminal V4. The switching MOSFET Q16 supplies a signal supplied thereto from the terminal V4 to the vertical scanning line VL2. The switching MOSFET Q17 supplies a signal supplied thereto from the terminal V4 to the gate of the switching MOSFET Q9 which couples the horizontal signal line HS2 to the output line VS. In order to prevent the high level of the output signal from lowering by an amount corresponding to the threshold voltage of the switching MOSFETs Q16 and Q17, a capacitor C2 is provided between the gate of the MOSFET Q16 and the output side (source side) of the MOSFET Q17, although not necessarily limitative thereto. Thus, the gate voltage of the MOSFETs Q16 and Q17 can be raised by the bootstrap action by the capacitor C2 by changing the potential at the terminal V4 at the same timing as that described above.

The terminal V3 is provided in common to switching MOSFETs for driving which are provided in correspondence with odd-number vertical scanning lines (horizontal signal lines), while the terminal V4 is provided in common to even-number vertical scanning lines (horizontal signal lines).

As will be understood from the foregoing, it is possible to effect a read operation in the interlace mode by combining together the operation of selectively supplying timing signals to the terminals V3 and V4 and the operation of selecting two rows simultaneously which is effected by the interlace gate circuit ITG. For example, if, in the case of an odd-number field FA, the terminal V3 is supplied with a timing signal synchronized with the operation of the vertical shift register VSR with the terminal V4 placed at the low level, the vertical scanning lines (horizontal signal lines) can be selected in the following sequence: VL1 (HS1), VL3 (HS3) . . . In the case of an even-number field FB, the terminal V4 is supplied with a timing signal synchronized with the operation of the vertical shift register VSR with the terminal V3 placed at the low level, and it is thereby possible to select the vertical scanning lines (horizontal signal lines) in the following sequence: VL2 (HS2), VL4 (HS4) . . .

On the other hand, if the terminals V3 and V4 are simultaneously raised to the high level in the same manner as the above, a scanning process in which a pair of rows are simultaneously selected can be effected in accordance with the output signals from the interlace gate circuit ITG. In this case, since the combination of pairs of rows which are selected for each of the two fields in accordance with the field signals FA and FB is shifted vertically by an amount corresponding to one row as described above, it is possible to realize a vertical shift of spatial centroid, that is, an equivalent interlace mode.

If, for example, the signal FB alone is raised to the high level, and the horizontal shift register HSR is operated twice in response to one vertical scanning timing to raise the terminals V3 and V4 to the high level synchronously therewith, it is possible to realize a select operation in the noninterlace mode in which the vertical scanning lines are selected in the following sequence: VL1, VL2, VL3, VL4 . . . In this case, it is preferable to double the frequency of the clock signals which are supplied to the horizontal shift register HSR and the vertical shift register VSR with a view to improving the picture quality. More specifically, if the frequency of the clock signals which are supplied to the horizontal and vertical shift registers HSR and VSR from terminals H1, H2 and V1, V2 is doubled, it is possible to read 60 pictures per minute in the non-interlace mode. It should be noted that terminals HIN and VIN supply input signals which are to be shifted by the shift registers HSR and VSR, respectively, and the shift operation of each shift register is started from the time when the input signal is supplied thereto. Accordingly, in the case where the above-described double-row simultaneous read scanning, interlaced scanning, noninterlaced scanning and the like are effected in accordance with the combination of input signals supplied to the interlace gate circuit ITG and the input terminals V3, V4, timing must be taken into consideration when the input signal is supplied to the shift register VSR so that the positional relationship between output signals in the vertical direction will not be reversed.

Resetting MOSFETs Q10 and Q11 are provided between the vertical scanning line VL1, the gate of the switching MOSFET Q8 corresponding thereto, and the ground potential point of the circuit. These resetting MOSFETs Q10 and Q11 are supplied with the clock signal from the terminal V2, the clock signal being supplied in common to all resetting MOSFETs provided in correspondence with the other vertical scanning lines and their corresponding switching MOSFETs, and the MOSFETs Q10 and Q11 operate to quickly draw the potential of the vertical scanning line in a selected state and the gate potential of the corresponding switching MOSFET to the low level.

In this embodiment, as described above, a vertical shift register VSRE, an interlace gate circuit ITGE and a driver circuit DVE for sensitivity control are additionally provided in order to add a sensitivity variable function. These circuits for sensitivity control are disposed on the left-hand side of the picture element array PD, although not necessarily liminative thereto. The vertical shift register VSRE, interlace gate circuit ITG and driver circuit DVE have circuit configurations similar to those of the above-described vertical shift register VSR, interlace gate circuit ITG and driver circuit DV for reading. Timing signals which are similar to the above are supplied from terminals V1E to V4E, VINE, FAE and ABE, respectively. In this case, the terminals V1E and V1 and the terminals V2E and V2 are supplied with the same clock signals, respectively, in order to allow the vertical shift register VSR for reading and the vertical shift register VSRE for sensitivity control to operate synchronously with each other, although not necessarily limitative thereto. Accordingly, the terminals V1E and V1 and the terminals V2E and V2 may be made common to each other, respectively, by an internal circuit. The reason why the independent terminals V1E and V2E are provided as described above is to enable this solid-state image sensor to be applied to television cameras having manually-operated diaphragms or a conventional mechanical diaphragm function. Thus, consideration is taken so that, when no sensitivity control operation is effected, the terminals V1E and V2E are placed at a low level such as the ground potential of the circuit to thereby prevent electric power from being wastefully consumed in the vertical shift register VSRE.

The following is a description of the sensitivity control operation of the solid-state image sensor circuit in accordance with this embodiment.

To facilitate the explanation, the vertical scanning operation in the above-described non-interlace mode will be taken as an example in the following description. For example, the vertical shift register VSRE, interlace gate circuit ITGE and driver circuit DVE for sensitivity control are made to effect a select operation for the fourth row (the vertical scanning line VL4; the horizontal signal line HS4) in parallel to the read operation for the first row (the vertical scanning line VL1; the horizontal signal line HS1) effected by the vertical shift register VSR, interlace gate circuit ITG and driver circuit DV for reading. Thus, photo signals accumulated in the photodiodes D1, D2 . . . in the first row are read out to the output signal line VS in a time-series manner in synchronism with the select operation for the horizontal scanning lines HL1, HL2 . . . in response to the horizontal scanning signal formed in the horizontal shift register HSR. This read operation is carried out by the supply of a current corresponding to each of the photo signals from the terminal S through a load resistor, and the precharge (reset) operation is carried out simultaneously with the read operation. A similar operation is also effected for the photodiodes disposed along the fourth row. In this case, the read operation for the fourth row is effected with respect to the dummy output line DVS by the above-described scanning circuit (VSRE, ITGE and DVE) for sensitivity control. In the case where the sensitivity control operation alone is conducted, the terminal RV is supplied with the same bias voltage as that applied to the terminal S. Thus, the photo signal which has already been accumulated in each of the picture element cells disposed along the fourth row is swept out, that is, a reset operation is effected.

Accordingly, the read operation for the fourth row (the vertical scanning line VL4; the horizontal signal line HS4) by the vertical shift register VSR, interlace gate circuit ITG and driver circuit DV is carried out after the read operation for the first to third lines by the above-described vertical scanning operation. Therefore, the storage time of the photodiode in each of the picture element cells disposed along the fourth row is equal to the time which is required to read all the picture element cells for the three rows.

In place of the above-described operation, the vertical shift register VSRE, interlace gate circuit ITGE and driver circuit DVE for sensitivity control are made to effect a select operation for the second row (the vertical scanning line VL2; the horizontal signal line HS2) in parallel to the read operation for the first row (the vertical scanning line VL1; the horizontal signal line HS1) effected by the vertical shift register VSR, interlace gate circuit ITG and driver circuit DV for reading. Thus, photo signals accumulated in the photodiodes D1, D2 . . . in the first row are read out to the output signal line VS in a time-series manner in synchronism with the select operation for the horizontal scanning lines HL1, HL2 . . . in response to the horizontal scanning signal formed in the horizontal shift register HSR. This read operation is carried out by the supply of a current corresponding to each of the photo signals from the terminal S through a load resistor, and the precharge (reset) operation is carried out simultaneously with the read operation. A similar operation is also effected for the photodiodes D3, D4 . . . which are disposed along the second row. Thus, the photo signal which has already been accumulated in each of the picture element cells disposed along the second row is swept out, that is, a reset operation is effected. Accordingly, the read operation for the second row (the vertical scanning line VL2; the horizontal signal line HS2) by the vertical shift register VSR, interlace gate circuit ITG and driver circuit DV is carried out after the read operation for the first row by the above-described vertical scanning operation. Therefore, the storage time of the photodiode in each of the picture element cells disposed along the second row is equal to the time which is required to read all the picture element cells for one row. Thus, the virtual storage time of the photodiodes can be reduced to one third of that in the case of the above, that is, it is possible to lower the sensitivity to one third of that in the above-described case.

As described above, the picture element cells disposed along a particular row are reset by the preceding vertical scanning operation carried out by the scanning circuit for sensitivity control. Therefore, the time interval from the reset operation to the start of the actual read operation carried out by the scanning circuit for reading is determined to be a storage time for the photodiodes. Accordingly, in a picture element array consisting of 525 rows, it is possible to set a storage time over a considerably wide range, i.e., in 525 steps at maximum with the read time for one row as a unit (minimum storage time or lowest sensitivity), that is, it is possible to set sensitivity at any of 525 levels, by the different addressing operations conducted by the above-described two vertical scanning circuits and the picture element select operation conducted by the common horizontal scanning circuit. However, it is assumed that variations in the illuminance at the light-receiving surface may be ignored with respect to the scanning time for the above-described one frame and substantially constant light is incident on the photodiodes. It should be noted that the highest sensitivity (525) is obtained when the scanning circuit for sensitivity control is in an inoperative state.

In the sensitivity control operation as described above, the read operation of the picture element signals and the reset operation thereof by the preceding vertical scanning operation are simultaneously carried out. Then, the picture element signals for the reset operation may be mixed into the read signals due to capacitive coupling through the substrate, etc. Such capacitive coupling will provide noise (such as ghost in a television receiver) to the read picture element signals, thereby deteriorating the resultant image quality.

In order to overcome this, this embodiment adopts a function of forcibly placing all the horizontal scanning lines in their selected state for the above horizontal scanning lines HL1, HL2, etc. from the external terminal SP through MOSFET's Q30, Q31, etc. in diode connection. More specifically, when the above terminal SP is placed in the high level, all the MOSFETs Q30, Q31, etc. in a diode manner turn on regardless of the operation of the horizontal shift register HSR to provide the high level to all the horizontal scanning lines such as HL1, HL2, etc., thereby placing them in their selected state. On the other hand, when the above terminal SP is placed in the low level, the MOSFETs Q30, Q31, etc. maintain their off-state since the above selection (high) level is supplied through uni-directional elements such as the MOSFETs Q30, Q31, etc. in a diode manner. Thus, the provision of the above forcible simultaneous selection circuit does not hinder the horizontal scanning lines HL1, HL2, etc. from being placed in the selection level in time sequence in accordance with the shift operation of the horizontal shift register HSR. Further, in order that the shift operation is not adversely affected by the forcible selection level of the horizontal scanning lines HL1, HL2, etc. because the horizontal shift register HSR is formed in a dynamic type circuit or the like, a switch circuit or the like for preventing the above selection level from being delivered to the interior of the horizontal shift register HSR may be provided.

The simultaneous selection operation of the horizontal scanning lines HL1, HL2, etc. is carried out during the horizontal blanking period described later and also the preceding vertical scanning is started. Thus, the signals of all the picture elements on the row to be reset can be previously forcibly reset. Therefore, in reading picture element signals, the picture element signals are not substantially provided from the preceding row because of the selection operation of the horizontal scanning lines by the horizontal shift register HSR. Then, even if there is some capacitive coupling through the substrate, the read signals do not provide the undesired noise as mentioned above.

Figure 10:
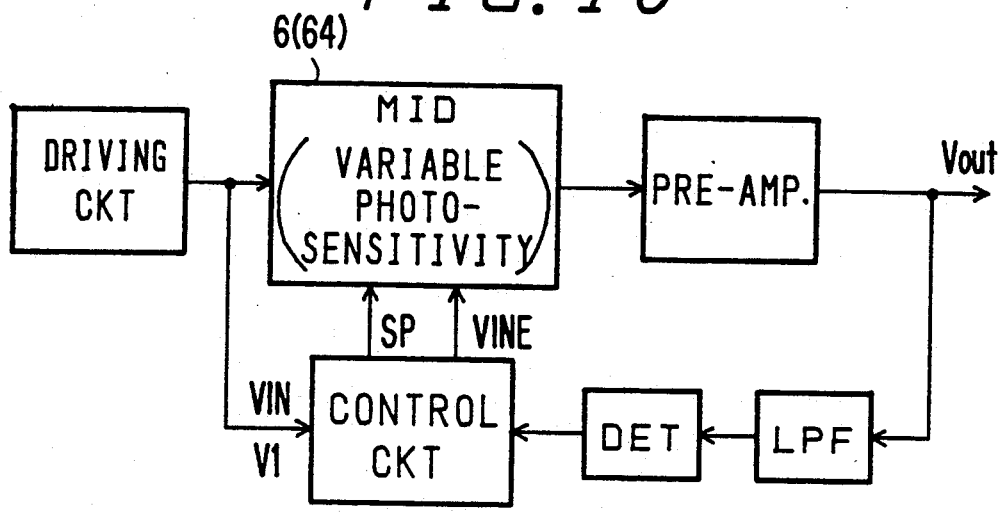
FIG. 10 is a block diagram showing one embodiment of an image pick-up device using the solid-state image pick-up chip.

FIG. 10 shows a block diagram of one embodiment of an image pick-up device having an automatic diaphragm function using the above solid-state image sensor.

The solid-state image sensor MID has a sensitivity control function as previously explained with reference to FIG. 9. The read signal from the solid-state image sensor MID is amplified by a preamplifier (pre-amp). The amplified signal $V_{out}$ from the pre-amplifier is, on one hand, to a signal processing circuit (not shown) s e.g. a television image signal. The amplified signal $V_{out}$ is, on the other hand, used for automatic diaphragm control. More specifically, the above amplified signal $V_{out}$ is supplied to a low-pass filter LPF to convert it into its average signal level. This signal, although not limitative, is supplied to a detection circuit DET to convert it into a D.C. signal. A sensitivity control circuit compares the signal received from the detection circuit DET with a desired diaphragm amount to produce a control signal corresponding to an optimum diaphragm. Namely, the sensitivity control circuit receives the signals VIN, V1, etc. from a driving circuit (which supplies clock signals for controlling the scanning timings as mentioned above to the solid-state image sensor MID), referring to the reading timings of the solid-state image sensor MID, to produce a timing signal VINE substantially preceding thereto. The preceding timing signal VINE corresponding to a necessary diaphragm amount (sensitivity) is produced referring to the timing signal VIN so that the timing signal VINE is actually later than the timing signal VIN. However, since the scanning is repeatedly carried out, the signal VINE is regarded to be earlier than the signal VIN in the subsequent scanning of the frame. For example, if the timing signal VINE later than the timing signal VIN by one row is produced, in the subsequent scanning frame, the timing signal VINE is regarded to be earlier than the timing signal VIN by 524 rows. Since the shifting operation in the respective shift registers VSR and VSRE is started using the above timing signals VIN and VINE, the sensitivity control operation as previously mentioned will be carried out.

The sensitivity control circuit change the diaphragm amount step by step in accordance with the comparison result of a reference voltage corresponding to a desired diaphragm amount with the output voltage from the detection circuit DET by e.g. a voltage comparison circuit. In order to enhance the response, the sensitivity control circuit decides the diaphragm amount in accordance with the output signal from the voltage comparison circuit in sequence from the most significant bit of a binary signal corresponding to 525 steps of the diaphragm amount. For example, using the diaphragm amount of about ½ (sensitivity of 256) as a reference, if the signal from the detection circuit DET is larger than the reference voltage, a diaphragm amount of ¼ (sensitivity of 128) is decided, and if it is smaller than the reference voltage, a diaphragm amount of ¾ (sensitivity of 384) is decided, and successively the half diaphragm amounts thereof are decided.

Thus, an optimum diaphragm amount of 525 steps of the sensitivity can be obtained by ten times setting operations. Assuming that the operation of setting the diaphragm amount, i.e. initialization operation (VINE) of the vertical shift register VSRE for sensitivity control is carried out during the vertical blanking period, the optimum diaphragm amount can be set in accordance with the signal reading operation from 10 fields.

The sensitivity control circuit produces the signal SP for the forcible resetting operation during the horizontal blanking or retrace period (although not necessarily limited thereto). In response to this SP signal, the sensitivity control circuit produces a signal for vertical selection on the preceding row during the horizontal blanking or retrace period.

In the image sensor according to this embodiment, a sensitivity control function is incorporated in the image sensor MID, and the above sensitivity control circuit is formed in a semiconductor integrated circuit since the level of the read-out signal from the sensor MID is decided to electrically control the sensitivity. Thus, the image sensor according to this embodiment can be made to be compact, light and very durable. It is suitable to a monitor camera which is located in the environment where brightness changes day and night. The monitor camera can be made so compact that its presence is concealed.

Figure 11:
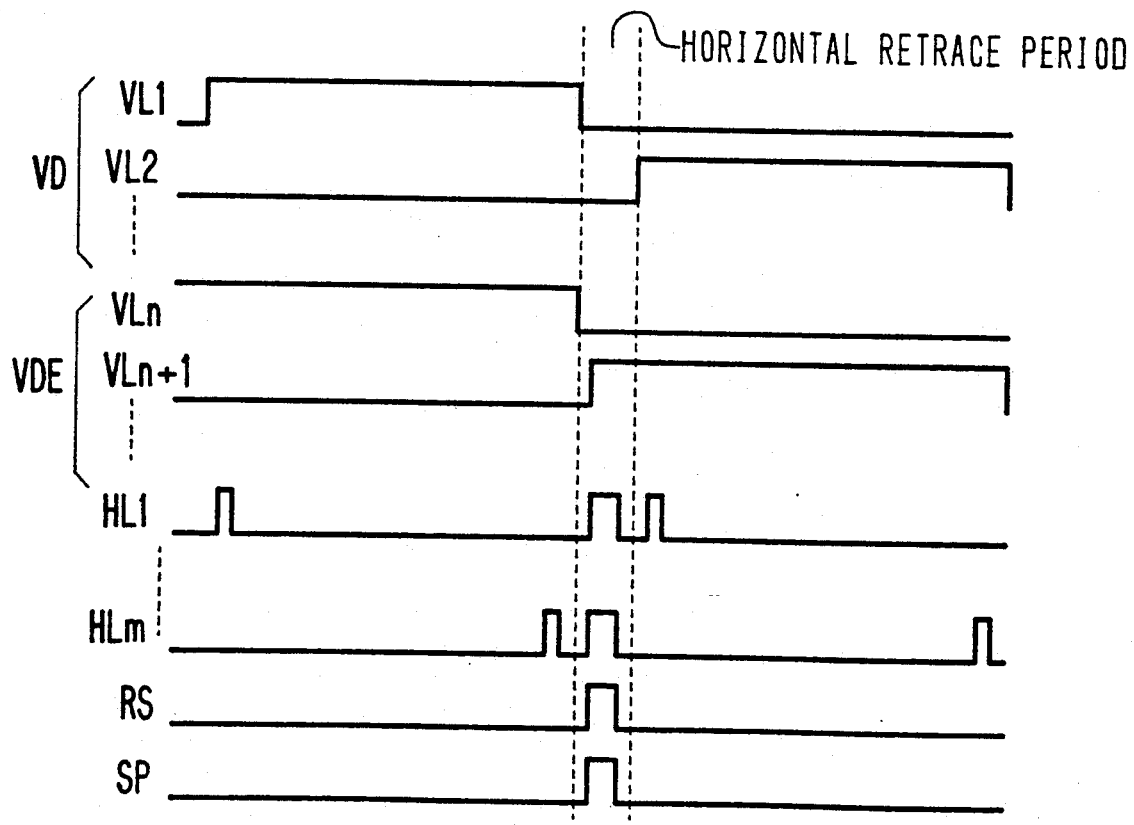
FIG. 11 is a timing chart showing one exemplary operation of the solid-state image pick-up chip.

FIG. 11 is one exemplary timing chart of the reading operation in the above solid-state image sensor.

For example, when the vertical scanning line VL1 is at the high level, the reading operation on the first row is performed by successively raising the horizontal scanning lines HL1 to HLm to the high level in time sequence. In this way, the current corresponding to the photo signal stored in the photodiode of the picture element cell successively selected flows so that the read operation from the picture element and the reset (precharge) for the subsequent read operation are simultaneously carried out. The voltage signal generated by causing the photo current to flow through the load resistor is amplified by the preamplifier shown in FIG. 10 and outputted. Likewise, when the preceding vertical scanning VLn is at the high level, the reset operation on the n-th row is carried out by the selection operation of the horizontal scanning lines HL1 to HLm in time sequence.

Upon completion of the read and reset operations of the above pair of rows (1, n) the horizontal blanking period is initiated. During this horizontal blanking period, the vertical scanning VL1 and VLn are raised from the high level to the low level, i.e. are switched to the non-selected state. And the terminal RP is raised to the high level and the MOSFETs Q27, Q29, etc. for the reset operation are turned on. Thus, the reset of the above-mentioned false signals generated on the horizontal signal lines HS2, etc. in the non-selected state. The terminal SP is also raised to the high level to forcibly place all the horizontal scanning liens HL1 to HLm in the selected state. Then, the vertical scanning line $VL_{n+1}$ corresponding to the subsequent row which precedes for sensitivity control. Thus, the read (reset) of all the picture elements on one line corresponding to the vertical scanning line $VL_{n+1}$ for the sensitivity control is carried out.

When upon completion of the horizontal blanking period, the read operation of the second row is started. Then, the horizontal scanning lines HL1 to HLm are successively raised to the high level in time sequence to provide the above read signals on the horizontal signal HS2. In this case, any signal is not provided in the horizontal signal line $HS_{n+1}$ on the preceding (n+1)-th row because the forcible reset has just been performed. If it were provided, it is a negligibly minute signal. If it were provided, it is a negligibly minute signal. Therefore, even if there is capacitive coupling between both horizontal signal lines (HS1, $HS_{n+1}$) through the substrate, etc. the swept signal by the reset signal does not leak to the read signal side. Accordingly, the forcible reset operation during the horizontal blanking period can provide read-out signals with high quality.

Meritorious effects provided by this embodiment are as follows.

(1) There are provided a first scanning circuit which produces the signals on a plurality of two-dimensionally arranged picture element cells in time sequence and a second scanning circuit which selects the vertical scanning direction by an address distinct from the address in the vertical scanning address selected by the first scanning circuit. And by precedently operating the second scanning circuit, the sensitivity of the image sensor can be controlled. Further, there is provided an external terminal for simultaneously forcibly placing the horizontal scanning lines (which selects the above two-dimensionally arranged picture element cells in their horizontal direction). Simultaneous selection signals from the second scanning circuit and the external terminal permit all the picture element signals on the preceding line to be reset (swept away) during the horizontal blanking period. Thus, any substantial picture element signal is not produced on the horizontal signal line corresponding to the preceding vertical scanning line so that coupling noise can be removed from the read picture element signals.

(2) By precedently performing the vertical scanning by the above-mentioned second scanning circuit to that by the first scanning circuit, the storage time of the photo-electric conversion device can be controlled in accordance with a time difference between both vertical scannings.

(3) The above items (1) and (2) realize the solid-state image sensor which maintains the high image quality and also has the sensitivity control function.

The present invention has been concretely explained in connection with its one embodiment. However, the present invention is not limited to the embodiment but can be modified and changed in several forms without departing from its spirit and scope. For example, in the circuit of FIG. 9, the interlace gate circuit and the driver circuit may take several forms in accordance with the scanning systems used. Further, the vertical scanning line on the preceding row may be placed in the selected state only during the horizontal blanking period. In this case, only the horizontal signal line corresponding to the row to be read provides a read-out signal so that the above-mentioned noise due to capacitive coupling can be completely removed.

Embodiment 5

FIG. 1A is a sectional view of a video camera unit according to one embodiment of the present invention and FIG. 1B is a plan view when viewed from above. FIG. shows a section taken along line 1A—1A in FIG. 1B. In order to obviate complexity of the drawing, FIG.

1B shows only the main parts (some of the parts corresponding to FIG. 1A are omitted).

Figure 12A:
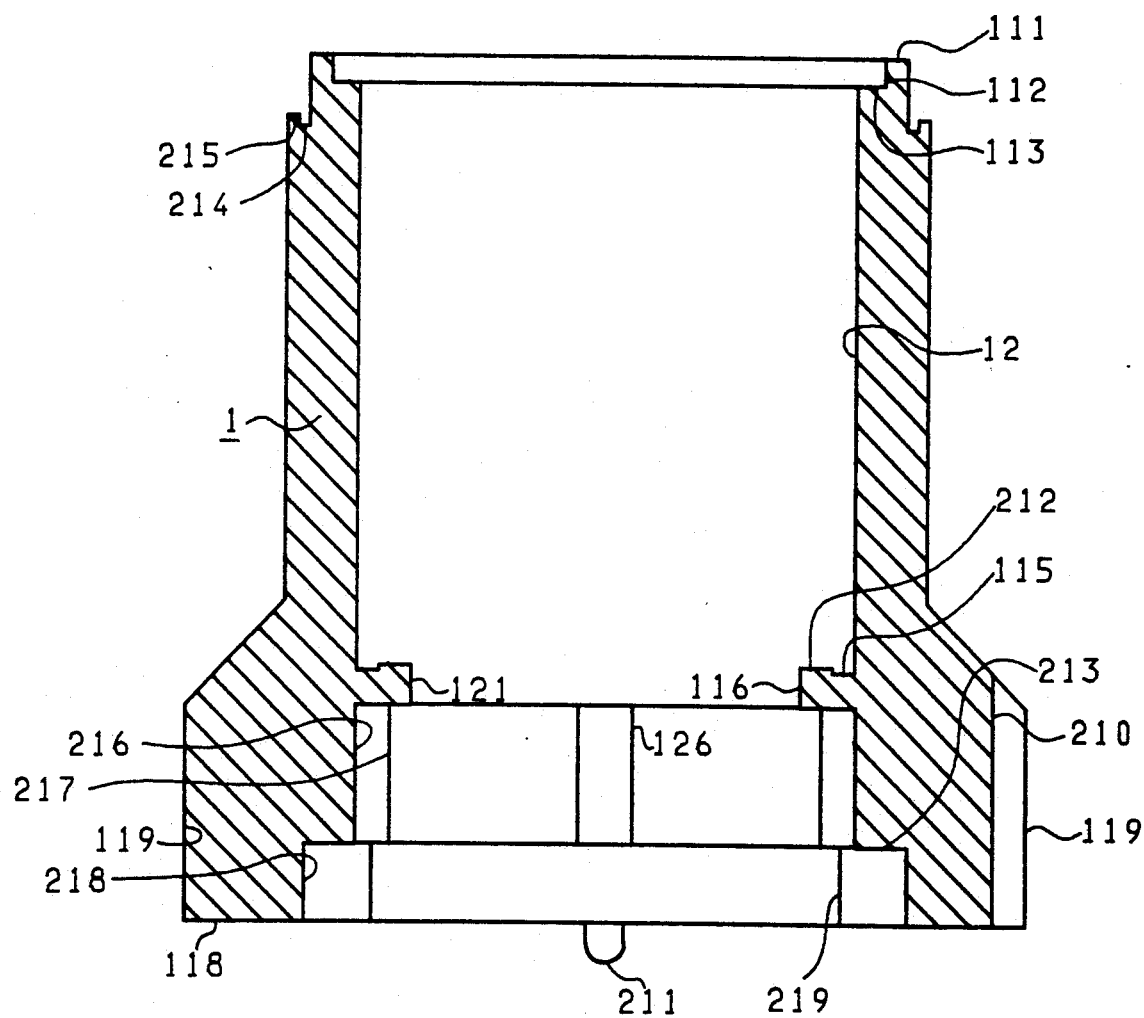
Figure 12B:
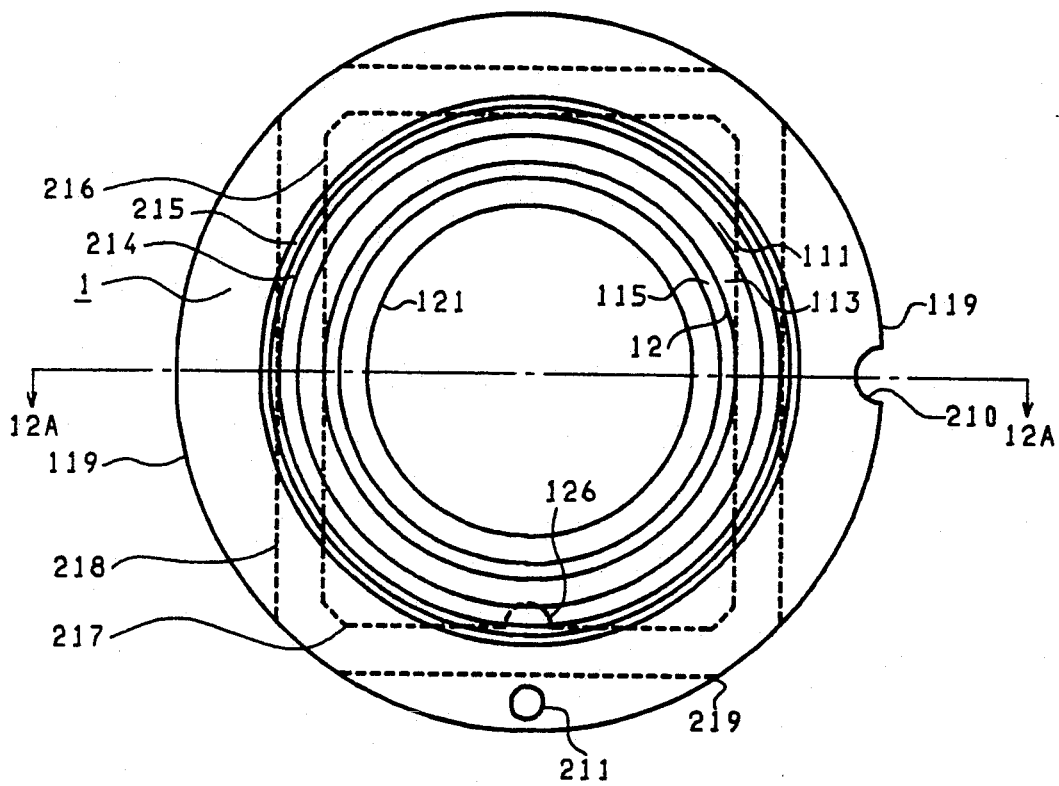
Figure 13A:
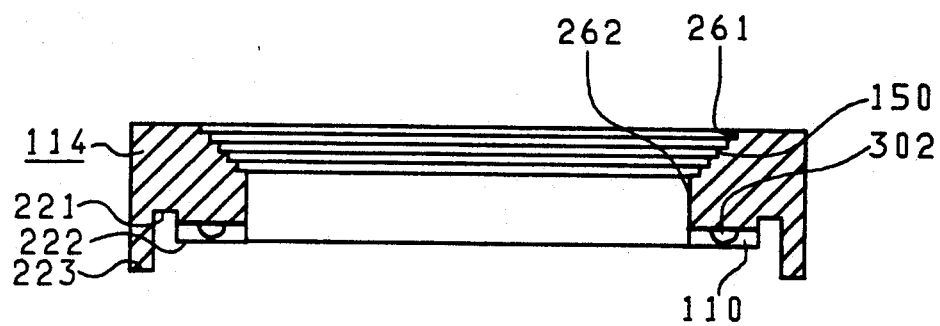
FIG. 13A is a sectional view of a lens holding cover 114 and FIG. 13B is a plan view thereof.
Figure 13B:
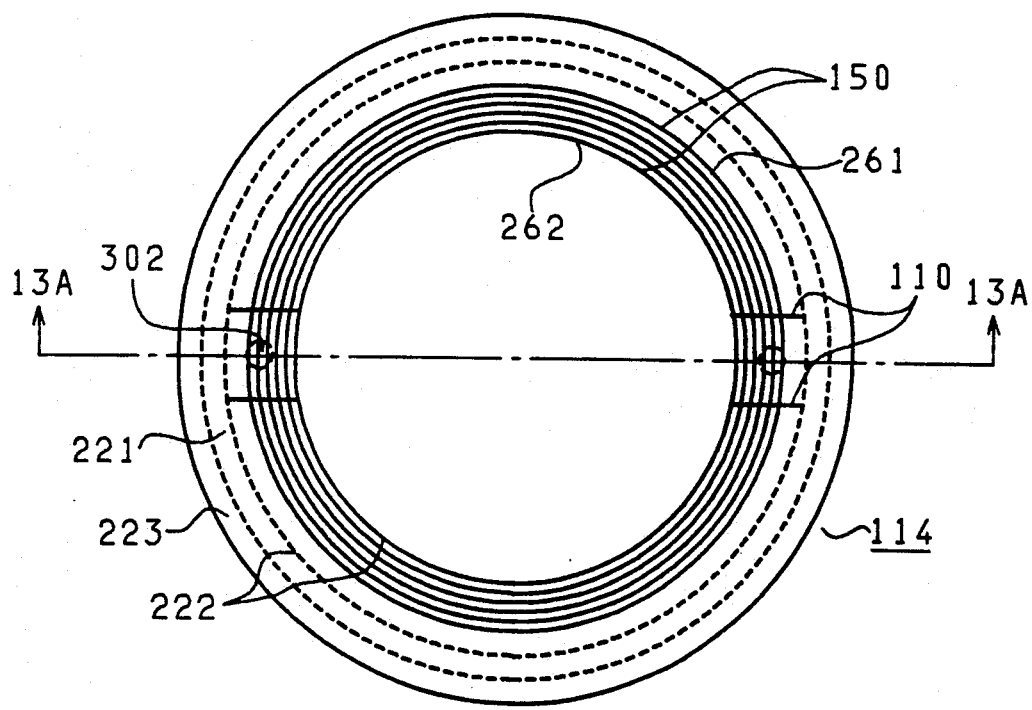

The corresponding parts in FIGS. 1A and 1B and FIGS. 5 and 6 have the same reference numbers. Of the components used in FIGS. 1A and 1B, a shield case 200 is individually shown in FIGS. 1A and 1B, a lens holding cover 114 is individually shown in FIGS. 13A and 13B, the holder 1 is individually shown in FIGS. 12A and 12B, and the solid-state image sensor 6 is individually shown in FIGS. 14A to 14C. The following explanation will be mainly directed to FIGS. 1A and 1B (see these individual figures as required).

The holder 1, the lens holding cover 114 and a substrate 249 of the solid-state image sensor 6 are made through plastic shaping and are black in their color to prevent diffused reflection. The cover 114, the holder 1 and the substrate 249 contain glass fiber mixed as filler during the plastic shaping to increase their mechanical strength and to reduce their thermal expansion coefficient. The holder 1 and the cover are made of the plastic material of polycarbonate resin that can be easily shaped (i.e. having high shaping accuracy). The substrate 249, which is required to be heat-resistant because of soldering of lead wires 61 to a printing board, etc., is made of the plastic material of polyphenylene sulfide.

A shield case 200 serves to prevent the solid-state image sensor 6 from suffering from electrostatic noise from the exterior, and is made of conducting material such as copper. The shield case 200 is provided, at its bottom, with doughnut shape horizontal portions 204 and leg portions 203 extending horizontally therefrom in four directions. The leg portions 203 serve to fix the shield case to the printed circuit board, etc. This fixing is made through openings 202 provided in the leg portions 203 using screws or bolts. The shield case 200 is connected with a D.C. power supply and A.C. grounded through the bottoms of the leg portions 203 the surfaces of which are exposed. The shield case 200 also serves to mechanically protect the components installed therein and increase the moisture-resistant property thereof. On the right side, a portion 201 inwardly projecting is adapted to be fit in a concave portion 210 provided in the holder 1. Using these portions, the shield case 200 and the holder 1 can be positioned in their horizontal rotating direction. In order that the projection 201 does not restrict movement in the vertical direction when fitting the holder 1 in the shield case, the concave portion 201 of the holder 1 is adapted to be extended or opened upward.

The shield case 200 is, at its top, provided with a doughnut shape horizontal portion 205 on which a flat glass cap 250 is bonded with high airtightness so that any leak path of water, etc. is not formed therebetween. An inclined portion 301 of the holder 1 and an inclined portion 300 of the shield case 200 are in intimate contact with each other so that water or moisture crept from below at the boundary between the holder 1 and the shield is shut out at the inclined portions, thereby enhancing moistureproof of the lenses. In order to improve this sealing property, a slight clearance or gap is taken between the doughnut shape horizontal portion 205 of the case 200 and the lens holding cover 114 so that the inclined portion 300 of the case 200 is intimately contacted with the inclined portion 301 of the holder 1. Incidentally, the portions 300 and 301 are inclined for the purpose of enhancing the degree of contactness (if the portions are horizontal as shown in FIG. 2A, it is difficult to increase the contact degree).

The total height of the cover 114 and the holder 1 and the height of the shield case 200 are related with each other so that when they are assembled, the bottom of the holder 1 is located at a slightly lower position than the bottom 204 of the shield case 200, i.e. projected therefrom. The thickness of the lower substrate 249 of the solid-state image sensor 6 (length of line 245) is set to be shorter than the depth of a groove 218 of the holder 1 (length of line 218). In other words, the bottom 118 of the holder 1 is designed to project downwardly from the bottom 204 of the shield case 200 and the bottom of the substrate 249 so that the horizontal accuracy of attaching the structure (unit) to a printing board, etc. is decided by the bottom 118 of the holder 1 but not influenced from the shield case 200 and the solid-state image sensor 6 which can not enhance the horizontal accuracy.

The shield case 200 is formed by pressing a copper disk sheet ten times or so so that its thickness is finally about 0.2 mm. The outer surface of the shield case 200 is painted black to prevent light from being reflected therefrom. A typical technique thereof is a so-called drilube treatment in which baking is made after the painting. In this case, the doughnut shape horizontal portion 205 is not painted through a masking technique or the like so that the contactness thereof with the glass cap 250 is not deteriorated. The leg portions 203 and the lower horizontal portion 204 are also not painted through the masking technique or the like so that an electrical contact resistance thereof with the printing board is not increased.

The transparent cap 250, which is made of glass, serves to seal the upper part of the unit and also to cut ultraviolet rays which will deteriorate the plastic lenses L1 to L4. The glass material has also other features in taking images such as being difficult to scratch, heat-resistance as compared with plastic material.

Concave portions 110 (two for left and right central portions in FIG. 13B) provided in the lens holding cover 114 serve to lower the periphery of projecting (convex) portions 302 remaining at the gate portions which are injection openings of resin in shaping the resin so as to prevent the convex portion 302 from projecting the flat portions 222 of the lens holder 114. Thus, the accuracy of holding the lenses is decided by the flat portions 222. The concave portions 110 can be also used as a reservoir of adhesive overflowed when the cover 114 is bonded.

The cap 250 is previously bonded to the shield case 200 for easiness of the subsequent assembling. Thereafter, an assembly of the shield case 200 and the cap 250 is assembled with the holder 1 which receives the lenses L1 to L4 therein and is provided with the holding cap 114.

An upper flat portion 212 of an inwardly projecting portion 116 of the holder 1 is precisely formed to attach the lens L4 with high precision so that its corner which is relatively difficult to work is provided with a concave portion 115 and the accuracy of attaching the lens will be decided by the flat portion 212. A projection 211 provided on the bottom of the holder 1 is an index indicating a direction, which is adapted to be inserted into a hole provided on one side in the printing board (it is of course that a hole is not provided on the opposite side). Thus, since the lead pins 61 are symmetrically arranged, it is possible to attach the video camera unit to the printing board in a correct attaching direction. The attaching position of the solid-state image sensor 6 in the vertical direction is decided by the horizontal portion 213 of the holder 1 and a frame flat portion 241 of the solid-state image sensor 6.

A ring shape groove 214 is formed between the small projection 215 and the large projection 111 on the upper side of the holder 1. This groove, which has a depth and width of about 0.2 mm, when the lens holding cap 114 is bonded to the holder 1, prevents excess adhesive from overflowing externally to uniformly spread the adhesive along the circumference. This groove 214 may be previously injected with the adhesive. In this case, the adhesive can be spread, through a capillary action, to the periphery of the groove 214 and the boundary between the cap 114 and the holder 1.

The height H1 of the projection 111 from the top surface thereof to the flat portion 113 and the depth D1 of the groove 221 from the bottom thereof to the flat portion 222 are related to be D1≧H1. A gap (0.1 mm width in this embodiment) is taken between the small projection 215 of the holder 1 and the lowermost surface 223 of the cap 114. Further, the height of the upper inner flat surface of the holder 1 is adapted to be equal to or lower than the upper flat surface 231 of the lens L1. These three conditions are required to surely hold the flat surface 231 with the bottom surface 223 of the cover 114.

Figure 14A:
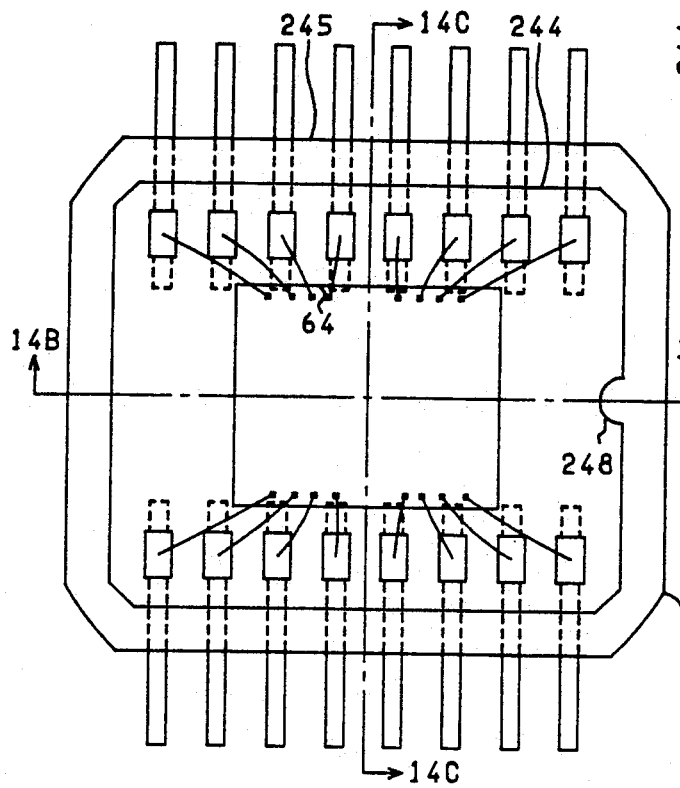
FIG. 14A is a plan view of a solid-state device 6 and FIGS. 14B and 14C are plan views thereof.
Figure 14C:
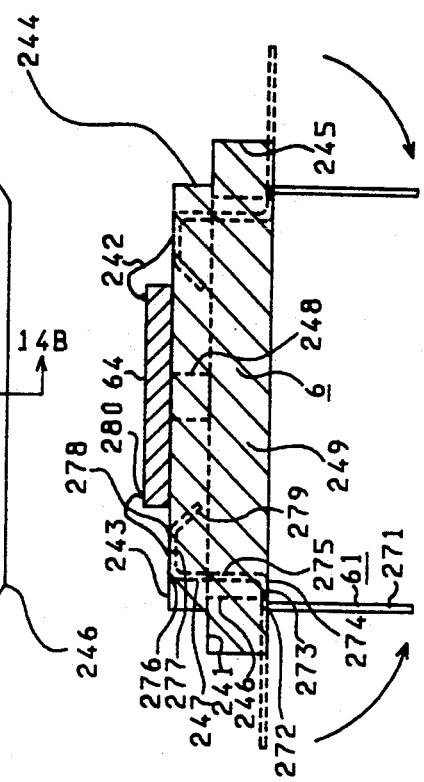
Figure 14B:
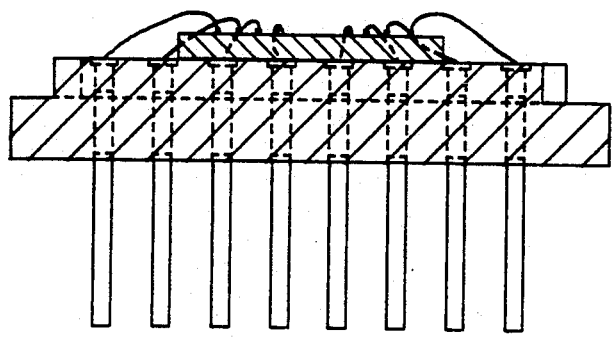
Figure 15A:
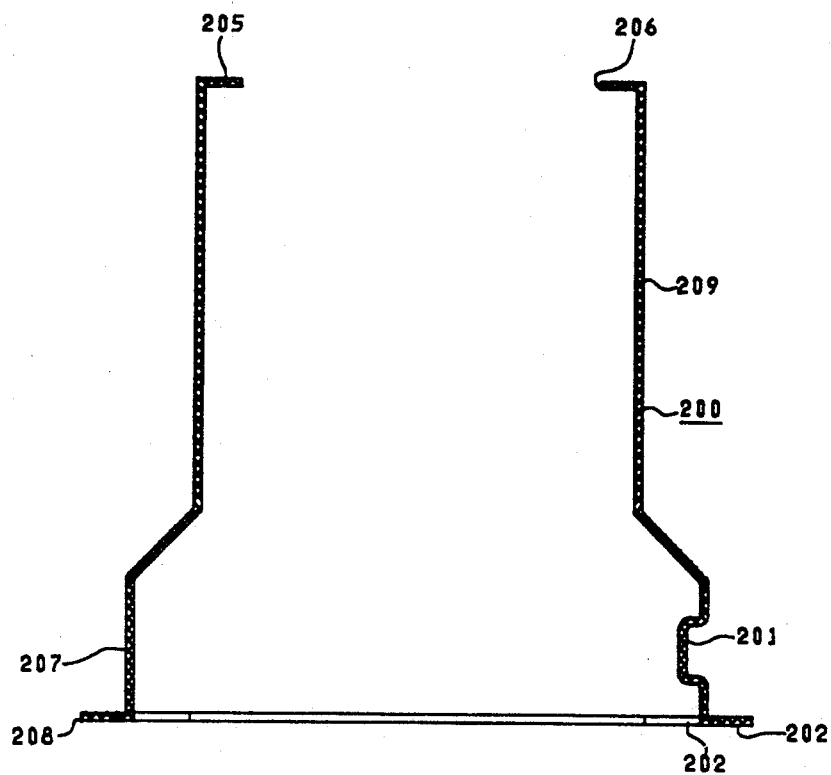
FIG. 15A is a sectional view of a shield case 200 and FIG. 15B is a plan view thereof.
Figure 15B:
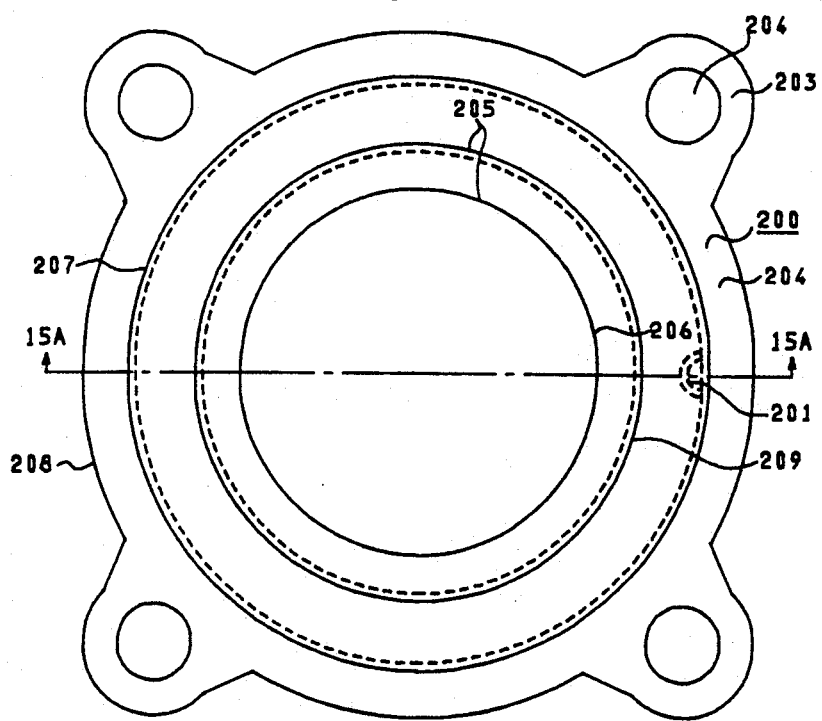

Explanation will be given for the solid-state image sensor 6 particularly referring to FIGS. 14A to 14C. For sake of explanation, the plan view of FIG. 14A shows the status where the lead pins 61 are not bended externally (towards the printing board); the sectional view of FIG. 14B shows the status where they have been bended; and the sectional view of FIG. 14C shows both statuses before they are bended (dotted line) and after they have been bended.

The positions of the holder 1 and the solid-state image sensor 6 in the rotational direction are decided by the projection 126 of the holder 1 and the convex portion 248 of the device 6. The lead pins 61 of the device 6 are exposed not along the outside of the side 245 of a plastic substrate unlike the embodiment of FIG. 5 but downwardly through the substrate 249 to decrease the gap between the device 6 and the holder 1, thereby improving the moisture-resistance of the unit. An upper tip 279 of the lead pin 61 is bended downwardly at an angle of about 45° within the plastic substrate 249. This intends to improve the horizontal accuracy of its upper flat portion 277 and firmly fix the lead pin 61 within the substrate 249.

The upper flat portion 277 is exposed to the surface of the substrate 249. An alminum (Al) wire 280 having a diameter of about 25 μm is bonded to the above flat portion 277 and a bonding pad 280 of a chip 64 by means of the ultrasonic connection technique to electrically connect the flat portion 277 and the chip to each other. The lead pin 61 is bended by 90° at two positions. The part from 274 to 271 of the lead pin 61 is extended externally in the horizontal direction on the way of assembling. Thereafter, that part is bended downwardly by 90°. The bending point is not the point 274 (since if the lead pin 61 is bended at this point, it will be easily broken there), but the point 272 displaced toward the tip 271 of the lead pin 61.

A method for manufacturing the solid-state image sensor 6 will be explained with reference to FIGS. 16 and 17.

FIG. 16 is a plan view of a lead frame 300 which is a starting material of the lead pins 61. In this embodiment, the lead pins 61 encircled by a vertical frame 302 and a horizontal frame 301 correspond to one device, and the pin leads 61 corresponding to four devices are successively connected in the horizontal direction. Although an ordinary IC lead frame has a so-called tab lead for mounting a semiconductor chip, this embodiment is not provided with the tab lead. The lead frame 300 is formed in a pattern as shown by pressing a sheet of phosphor bronze. Phosphor bronze is selected because it has a high electrical conductivity, thermal expansion coefficient close to resin and flexibility so that it can be easily bended. So-called 42 alloy (Fe-Ni alloy containing iron of 42% by weight) may be used instead of phosphor bronze. Each of circular holes 303 as shown can be used as positioning holes in assembling and holes for transferring the lead frame. Each of bonding posts of the lead pins 61 for bonding the Al wires 242 is made larger in its width by a total of 0.1 mm (0.05 mm for left and right) than the remaining portion thereof so that bonding can be easily performed and also a sufficient distance is placed between the respective lead pins 61. The bonding post 277 is plated on its surface with Au to enhance its bonding capability to the Al wire 242, and the remaining portion is plated with solder to make it easy to be soldered to the printing board, etc.

An assembling process after the lead frame 300 has been formed will be explained with reference to FIG. 17. FIG. 17 corresponds to a side view when the plan view of FIG. 16 is taken in the vertical direction.

(a) The lead frame is pressed and partially plated with Au and solder. As a material for the solder plating, a material containing tin (Sn) of a substantially low ratio to lead (Pb) is selected to have a higher melting point than the temperature of plastic molding in step (c).

(b) The lead pin 61 is bended at three points of 278, 276 and 274.

(c) The lead frame 300 is plastic-molded.

(d) The lead pin 61 is bended at a point of 272.

(e) The solid-state image sensor chip (die) 64 is centrally bonded to the upper surface of the plastic substrate 249 by jetting immediately hardening and viscous epoxy resin from nozzles of an applier (die bonding). Then, the chip 64 is positioned referring to the holes 303 of the lead frame 300. This die bonding is carried out at a room temperature, and thereafter curing is performed at a temperature of about 160° C. to harden the epoxy resin. Thereafter, the Al wire 242 is ultrasonic-bonded to the bonding post 277 and the bonding pad 280 of the chip 64.

(f) Unnecessary portions (e.g. frame 301) of the lead frame 300 are cut off to complete the solid-state image sensor 6 (FIG. 1A). As an alternative, the unnecessary portions may be cut off after a unit consisting of the holder 1, the lenses L1 to L4 and the cover 114 is bonded to the substrate 249 and the shield case 200 is bonded thereon. In this alternative, a series of assembling steps can be easily automated on the lead frames 300 having many lead pins which are successively arranged.

The assembling process mentioned above and the lead frame 300 are different from the case of the ordinary integrated circuit in the following points.

(1) The plastic molding is carried for only the lead frame, and it is not carried out after the die bonding of the chip and the wire bonding have been completed.

(2) The molded plastic is used as a substrate for mounting the chip thereon but is not used to seal the chip.

(3) The bonding post 277 of the plastic-molded lead pin 61 is exposed to the surface of the plastic substrate but is not embedded in the plastic.

(4) After the plastic molding, the chip 64 is substantially sealed by the holder 1 and the shield case 200.

(5) The bending step of the lead pins has been carried out before the die bonding so that any stress is not applied to the chip during the bending step.

(6) Since those portions of the lead pins 61 which include their bonding posts 277 and their ends 271 are arranged in parallel with each other with a constant pitch, i.e., with a constant arrangement period, the shape of the lead pins 61 can be made simple.

In accordance with this invention, the lenses can be made compact and a mechanical diaphragm and a shutter mechanism can be omitted. Thus, the entire camera can be made very compact, which is very efficient particularly for a monitor camera.

TABLE 1

| Lens surface | $\gamma$ | d | n | $v$ |
|---|---|---|---|---|
| #1 | 0.888 | 0.208 (d1) | 1.492 | 56 |
| #2 | 0.848 | 0.436 (d2) | ... | |
| #3 | −1.024 | 0.366 (d3) | 1.492 | 56 |
| #4 | 13.381 | 0.332 (d4) | ... | |
| #5 | 2.039*1 | 0.488 (d5) | 1.492 | 56 |
| #6 | 0.725*2 | 0.229 (d6) | ... | |
| #7 | 0.996*3 | 0.416 (d7) | 1.492 | 56 |
| #8 | 1.060 | — | ... | |

| effective focal length | E.F.L = 1.0 |
|---|---|
| F number | F No. = 2.0 |
| field angle | F.A. = 87° |
| back focus | B.F = 0.55 |

$\gamma$: curvature radius of lens surface
d: distance between lens surfaces
n: refractive index of lens for d-line
$v$: dispersion rate of lens

TABLE 2

| | *1 | *2 | *3 |
|---|---|---|---|
| $K_2$ | 0 | 0 | 0 |
| $A_2$ | 0 | 0 | 0 |
| $A_4$ | $1.466 \times 10^{-2}$ | $3.460 \times 10^{-3}$ | $2.723 \times 10^{-3}$ |
| $A_6$ | $6.002 \times 10^{-3}$ | $3.002 \times 10^{-3}$ | $1.417 \times 10^{-3}$ |
| $A_8$ | $-2.382 \times 10^{-3}$ | $-6.772 \times 10^{-4}$ | $-4.251 \times 10^{-4}$ |
| $A_{10}$ | $3.149 \times 10^{-4}$ | $2.106 \times 10^{-5}$ | $3.955 \times 10^{-5}$ |

Notes:
Assuming that the x-ordinate is taken in the direction of an optical axis, the y-ordinate is in the direction perpendicular thereto, and the paraxial radius is $r_i$, the non-spherical shape is represented by $$r_i = \frac{y^2/r}{1 + \sqrt{1 - (k_2 + 1)(y^2/r^2)}} + A_2 y^2 + A_4 y^4 + A_6 y^6 + A_8 y^8 + A_{10} y^{10}$$

where $A_2, A_4, A_6, A_8$ and $A_{10}$ are non-spherical co-efficients.

TABLE 3

| Lens surface | SA | CM | AS | DS | PT |
|---|---|---|---|---|---|
| #1 | 0.0028 | −0.0028 | 0.0027 | −0.0792 | 0.0771 |
| #2 | −0.0021 | −0.0007 | −0.0002 | −0.0276 | −0.0807 |
| #3 | −0.0014 | 0.0101 | −0.0731 | 1.0100 | −0.0668 |
| #4 | −0.0006 | −0.0055 | −0.0482 | −0.4663 | −0.0051 |
| #5 | −0.0763 | −0.0213 | 0.0985 | 0.7035 | 0.0659 |
| #6 | 0.0214 | −0.0358 | −0.0721 | −0.1375 | 0.0944 |
| #7 | −0.0071 | −0.0228 | −0.1297 | 0.1329 | 0.0687 |
| #8 | 0.0004 | −0.0061 | 0.0765 | −0.1500 | −0.0646 |

TABLE 3-continued

| Lens surface | SA | CM | AS | DS | PT |
|---|---|---|---|---|---|
| total | −0.0630 | −0.0850 | −0.1456 | 0.9854 | 0.0889 |

Seidel aberration coefficients
SA: spherical aberration coefficient
CM: coma coefficient
AS: astigmatism coefficient
DS: distorsion aberration coefficient
PT: Petzval coefficient

TABLE 4

| Lens surface | $\gamma$ | d | n | $v$ |
|---|---|---|---|---|
| #11 | 1.067 | 0.372 | 1.492 | 56 |
| #12 | −2.572 | 0.211 | ... | |
| #13 | −0.372*1 | 0.267 | 1.492 | 56 |
| #14 | −0.368 | 0.295 | ... | |
| #15 | 0.473*2 | 0.211 | 1.492 | 56 |
| #16 | 0.550 | ... | ... | |

| effective focal length | E.F.L = 1.0 |
|---|---|
| F number | F No. = 2.0 |
| field angle | F.A. = 45° |
| back focus | B.F = 0.42 |

$\gamma$: curvature radius of lens surface
d: distance between lens surface
n: refractive index of lens for d-line
$v$: dispersion rate of lens

TABLE 5

| | *1 | *2 |
|---|---|---|
| $K_2$ | 0 | 0 |
| $A_2$ | 0 | 0 |
| $A_4$ | $3.6524 \times 10^{-3}$ | $3.4555 \times 10^{-3}$ |
| $A_6$ | $3.9891 \times 10^{-4}$ | $8.3953 \times 10^{-4}$ |
| $A_8$ | $-5.1950 \times 10^{-5}$ | $-2.5228 \times 10^{-4}$ |
| $A_{10}$ | $2.3457 \times 10^{-5}$ | $2.1174 \times 10^{-5}$ |

Notes:
Assuming that the x-ordinate is taken in the direction of an optical axis, the y-ordinate is in the direction perpendicular thereto, and the paraxial radius is $r_i$, the non-spherical shape is represented by $$r_i = \frac{y^2/r}{1 + \sqrt{1 - (k_2 + 1)(y^2/r^2)}} + A_2 y^2 + A_4 y^4 + A_6 y^6 + A_8 y^8 + A_{10} y^{10}$$

where $A_2, A_4, A_6, A_8$ and $A_{10}$ are non-spherical co-efficients.

TABLE 6

| Lens surface | SA | CM | AS | DS | PT |
|---|---|---|---|---|---|
| #11 | 0.0005 | 0.0001 | 0.0000 | −0.0128 | 0.0433 |
| #12 | 0.0010 | −0.0145 | 0.2076 | −3.2112 | 0.0180 |
| #13 | −0.0123 | 0.0923 | −0.6888 | 6.0639 | −0.1243 |
| #14 | 0.0119 | −0.0779 | 0.4188 | −2.7271 | 0.1258 |
| #15 | −0.0019 | −0.0054 | −0.0405 | 1.4448 | 0.0977 |
| #16 | 0.0000 | −0.0015 | 0.1065 | −1.5200 | −0.0845 |
| total | −0.0008 | −0.0071 | 0.0036 | 0.0376 | 0.0760 |

Seidel aberration coefficients
SA: spherical aberration coefficient
CM: coma coefficient
AS: astigmatism coefficient
DS: distorsion aberration coefficient
PT: Petzval coefficient

We claim:

1. An imaging assembly comprising a plurality of piled plastic lenses, a solid-state image sensor and a holder for incorporating said lenses and said image sensor therein so that said lenses and said image sensor are aligned with one another, wherein said holder is provided, on an inner wall corresponding to a portion incorporating said lenses, with a projection having a flat portion extending inwardly at a substantially right angle from the inner wall, wherein said lenses are adapted to be attached to the flat portion, and wherein said projection is provided with a groove between said flat portion and said inner wall to serve as a drain opening for air extruded when the lenses are successively piled on one another in the holder.

2. The imaging assembly according to claim 1, wherein each of said lenses has a rib, an outer surface of each said rib fitting the inner wall of said holder.

3. The imaging assembly according to claim 2, further comprising light-shielding rings inserted between said ribs of two of said lenses.

4. The imaging assembly according to claim 1, wherein said holder has a downward projected portion at the bottom surface of the lower end thereof.

5. The imaging assembly according to claim 1, wherein said holder is comprised of a plastic containing conductor particles or powder.

6. An imaging assembly according to claim 5, wherein said conductor particles or powder includes carbon.

7. The imaging assembly according to claim 1, further comprising a cylindrical metallic case covering the outer side surface of said holder, wherein the lower, outer surface of said case is spread outward compared with the upper, outer surface thereof, and wherein said case has a recessed portion at the outer surface of the spread area.

8. An imaging assembly according to claim 1, wherein said solid-state image sensor comprises an unsealed chip.

9. An imaging assembly comprising a plurality of lenses, a solid-state image sensor chip, an insulating substrate attached to said chip and to lead pins, and a holder for incorporating said lenses, said image sensor chip, said insulating substrate and said lead pins so that said lenses, said image sensor chip and said insulating substrate are aligned with one another, wherein said insulating substrate has a side surface formed in a predetermined stepped manner, and wherein said holder has an inner wall formed in a predetermined stepped manner in accordance with the shape of the side surface of said insulating substrate to permit aligning said insulating substrate with said holder in a manner to align said image sensor chip attached to the insulating substrate with said lenses.

10. An imaging assembly according to claim 9, wherein said holder is comprised of a plastic containing conductor particles or powder.

11. The imaging assembly according to claim 9, wherein said holder has a downward projected portion at the bottom surface of the lower end thereof.

12. An imaging assembly according to claim 9, wherein said solid-state image sensor chip comprises an unsealed chip.

13. The imaging assembly according to claim 9, wherein each of said lenses has a rib, an outer surface of each said rib fitting the inner wall of said holder.

14. The imaging assembly according to claim 13, further comprising light-shielding rings inserted between said ribs of two of said lenses.

15. An imaging assembly comprising:
a solid-state imaging sensor chip;
a plurality of plastic lenses, predetermined ones of which have a non-spherical surface;
a cylindrical plastic holder containing therein said chip at a lower position and said lenses at an upper position such that said lenses and said chip are aligned with one another;
a cylindrical metallic case covering an outer side surface of said holder, an upper end of said case being bent inward to form an edge portion
a glass plate formed on the edge portion of the cylindrical metallic case; and
a cap having a doughnut shape assembled between the upper end portion of said holder and said edge portion of said case for fixing said lenses in said holder,
wherein said upper end portion of said holder has recessed and projected portions, wherein a lower end portion of said cap also has recessed and projected portions corresponding to match the recessed and projected portions of said holder, and wherein a gap is provided between the lower end portion of the outer periphery of said cap and the upper end portion of the outer periphery of said holder.

16. An imaging assembly according to claim 15, wherein said solid-state imaging sensor chip comprises an unsealed chip.

17. The imaging assembly according to claim 15, wherein each of said lenses has a rib, an outer surface of each said rib fitting an inner wall of said holder.

18. The imaging assembly according to claim 17, further comprising light-shielding rings inserted between said ribs of two of said lenses.

19. An imaging assembly comprising:
a solid-state imaging sensor chip;
a plurality of plastic lenses, predetermined ones of which have a non-spherical surface;
a cylindrical plastic holder containing therein said chip at a lower position and said lenses at an upper position such that said lenses and said chip are aligned with one another, wherein the lower, outer surface of said holder is spread outward compared with the upper, outer surface thereof, further comprising a cylindrical metallic case covering the outer side surface of said holder, wherein the lower, outer surface of said case is spread outward compared with the upper, outer surface thereof.

20. An imaging assembly according to claim 19, wherein said solid-state imaging sensor chip comprises an unsealed chip.

21. The imaging assembly according to claim 19, wherein each of said lenses has a rib, an outer surface of each of said rib fitting an inner wall of said holder.

22. The imaging assembly according to claim 21, further comprising light-shielding rings inserted between said ribs of two of said lenses.

23. The imaging assembly according to claim 19, wherein an upper end of said case is bent inward to form an edge portion on which said glass plate is secured.

24. The imaging assembly according to claim 23, further comprising a cap having a doughnut shape assembled between the upper end portion of said holder and said edge portion of said case for fixing said lenses in said holder.

25. The imaging assembly according to claim 23, wherein the lower end of said case is bent outward to form a plurality of foot portions, each of said foot portions including an opening.

26. The imaging assembly according to claim 19, wherein said case has a recessed portion at the outer surface of the spread area.

* * * * *